United States Patent
Kim

(10) Patent No.: US 9,666,292 B2
(45) Date of Patent: May 30, 2017

(54) METHOD OF DETERMINING DEFAULT READ VOLTAGE OF NON-VOLATILE MEMORY DEVICE AND METHOD OF READING DATA OF NON-VOLATILE MEMORY DEVICE

(71) Applicant: SAMSUNG ELECTRONICS CO., LTD., Suwon-si, Gyeonggi-Do (KR)

(72) Inventor: Kyung-Ryun Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 97 days.

(21) Appl. No.: 14/743,311

(22) Filed: Jun. 18, 2015

(65) Prior Publication Data

US 2016/0042797 A1    Feb. 11, 2016

(30) Foreign Application Priority Data

Aug. 8, 2014  (KR) .................. 10-2014-0102312

(51) Int. Cl.

| | | |
|---|---|---|
| *H03M 13/00* | (2006.01) | |
| *G11C 16/26* | (2006.01) | |
| *G11C 16/10* | (2006.01) | |
| *G11C 16/34* | (2006.01) | |
| *G11C 29/52* | (2006.01) | |

(Continued)

(52) U.S. Cl.
CPC .......... *G11C 16/26* (2013.01); *G06F 11/1072* (2013.01); *G11C 16/10* (2013.01); *G11C 16/3427* (2013.01); *G11C 29/021* (2013.01); *G11C 29/028* (2013.01); *G11C 29/52* (2013.01)

(58) Field of Classification Search
CPC ..... G11C 16/26; G11C 16/10; G11C 16/3427; G11C 29/028; G11C 29/52; G11C 29/021; G11C 11/5642; G11C 7/14; G11C 2029/0411; G11C 11/5628; G06F 11/1068; G06F 11/073; G06F 11/076; G06F 11/34; G06F 12/0246; G06F 17/30; G06F 2212/72; H03M 13/1105

See application file for complete search history.

(56) References Cited

U.S. PATENT DOCUMENTS

| | | |
|---|---|---|
| 7,760,555 B2 | 7/2010 | Guterman et al. |
| 7,889,563 B2 | 2/2011 | Cho et al. |

(Continued)

FOREIGN PATENT DOCUMENTS

KR    2009-0129205 A    12/2009

*Primary Examiner* — Guerrier Merant

(74) *Attorney, Agent, or Firm* — Volentine & Whitt, PLLC

(57) ABSTRACT

A method of determining a default read voltage of a non-volatile memory device which includes a plurality of first memory cells, each of which stores a plurality of data bits as one of a plurality of threshold voltages corresponding to a plurality of logic states, includes programming a first data to the first memory cells so that the logic states of the first memory cells are balanced or equally used. The method includes applying a first default read voltage included in default read voltages to word lines coupled to the first memory cells, and measuring a first ratio of first on-cells, each of which has a threshold voltage smaller than or equal to the first default read voltage, among the first memory cells, and modifying the first default read voltage based on the first ratio and a first reference value corresponding to the first default read voltage.

20 Claims, 24 Drawing Sheets

(51) Int. Cl.
*G11C 29/02* (2006.01)
*G06F 11/10* (2006.01)

(56) References Cited

U.S. PATENT DOCUMENTS

| | | |
|---|---|---|
| 8,355,285 B2 | 1/2013 | Huang et al. |
| 8,432,734 B2 | 4/2013 | Kim |
| 8,516,183 B2 | 8/2013 | Eun et al. |
| 8,605,502 B1 | 12/2013 | Desireddi et al. |
| 8,630,121 B2 | 1/2014 | Yang |
| 8,665,645 B2 | 3/2014 | Avraham et al. |
| 2010/0232229 A1 | 9/2010 | Ogawa et al. |
| 2012/0084490 A1* | 4/2012 | Choi ............... G11C 16/02 711/103 |
| 2014/0029336 A1 | 1/2014 | Venkitachalam et al. |
| 2015/0149840 A1* | 5/2015 | Alhussien ........ H03M 13/1125 714/719 |
| 2015/0149871 A1* | 5/2015 | Chen ............... G06F 11/1068 714/773 |
| 2016/0155495 A1* | 6/2016 | Oh .................. G06F 11/34 365/185.03 |

* cited by examiner

DECREASE THE FIRST DEFAULT READ VOLTAGE WHEN THE FIRST RATIO IS BIGGER THAN THE FIRST REFERENCE VALUE —S131

INCREASE THE FIRST DEFAULT READ VOLTAGE WHEN THE FIRST RATIO IS SMALLER THAN THE FIRST REFERENCE VALUE —S132

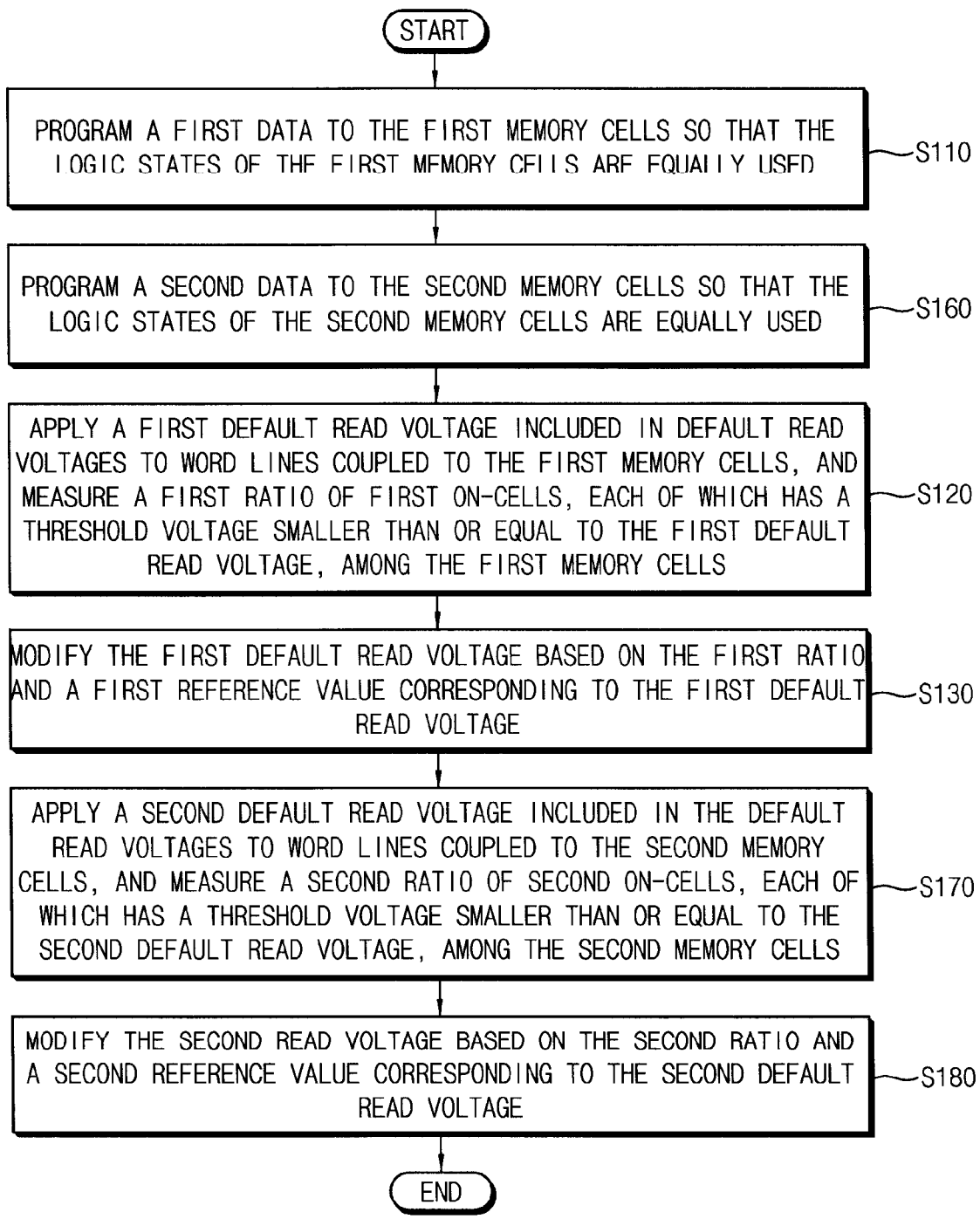

FIG. 11
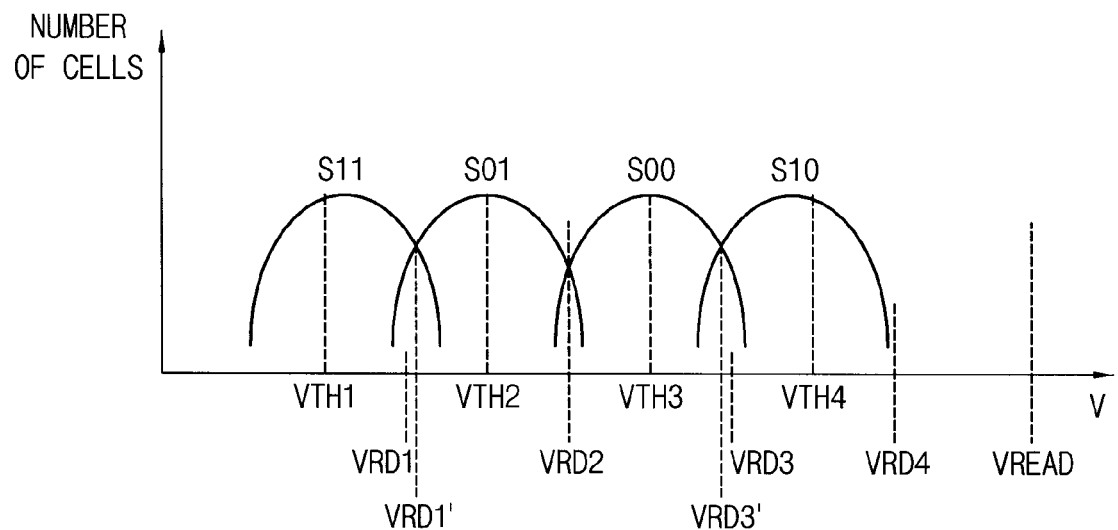
FIG. 12A
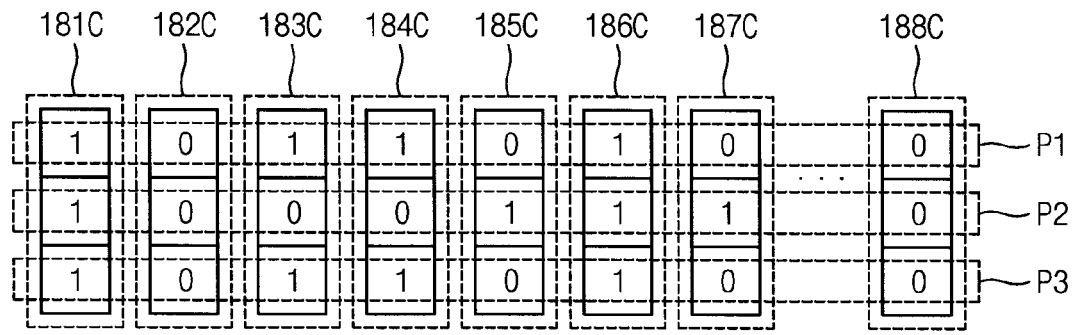
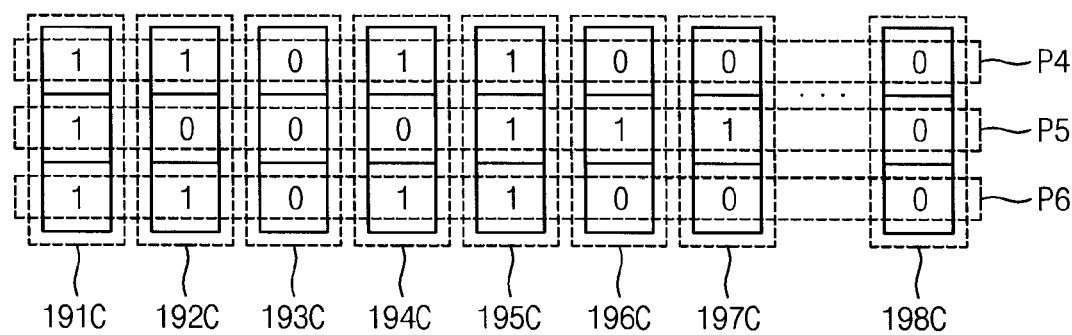

METHOD OF DETERMINING DEFAULT READ VOLTAGE OF NON-VOLATILE MEMORY DEVICE AND METHOD OF READING DATA OF NON-VOLATILE MEMORY DEVICE

CROSS-REFERENCE TO RELATED APPLICATION

This U.S. Non-provisional application claims priority under 35 USC §119 to Korean Patent Application No. 10-2014-0102312, filed on Aug. 8, 2014, in the Korean Intellectual Property Office (KIPO), the disclosure of which is incorporated by reference in its entirety herein.

BACKGROUND

1. Technical Field

Example embodiments relate generally to non-volatile memory devices, and more particularly to a method of determining a default read voltage of a non-volatile memory device and a method of reading data of the non-volatile memory device.

2. Discussion of the Related Art

Memory cells of a non-volatile memory device, such as a flash memory device, may store data by using multiple threshold voltage distributions to represent different logic states of the data. The data stored in the memory cells may be read by checking whether each memory cell is turned on or off when a predetermined read voltage is applied to the memory cell.

While or after the memory cells are programmed to have the threshold voltage distributions, each threshold voltage distribution may widen due to a charge leakage, a program disturb, electrical coupling, a change in temperature, a change in voltage, etc. If the threshold voltage distributions are widened, the data may be inaccurately read. That is, a read failure may occur. Once the read failure occurs, a conventional non-volatile memory device may perform a read retry. Since the read operations are repeatedly performed, a read time may be increased by the read retry.

To reduce the number of read retries, a method of determining a default read voltage of the non-volatile memory device to reduce or minimize read errors according to threshold voltage distribution of memory cells may be desired.

SUMMARY

At least one example embodiment of the inventive concept provides a method of determining a default read voltage of a non-volatile memory device to reduce or minimize read errors according to threshold voltage distribution of memory cells.

At least one example embodiment of the inventive concept provides a method of reading data of the non-volatile memory device after determining the default read voltage to reduce or minimize read errors according to the threshold voltage distribution of the memory cells.

At least one example embodiment of the inventive concept provides a non-volatile memory device that reads data of the memory cells after determining the default read voltage to reduce or minimize read errors according to the threshold voltage distribution of the memory cells.

According to example embodiments, a method of determining a default read voltage of a non-volatile memory device which includes a plurality of first memory cells, each of which stores a plurality of data bits as one of a plurality of threshold voltages corresponding to a plurality of logic states, includes programming a first data to the first memory cells so that the logic states of the first memory cells are equally used, applying a first default read voltage included in default read voltages to word lines coupled to the first memory cells, and measuring a first ratio of first on-cells, each of which has a threshold voltage smaller than or equal to the first default read voltage, among the first memory cells, and modifying the first default read voltage based on the first ratio and a first reference value corresponding to the first default read voltage.

In an example embodiment, the first reference value may be a ratio of second on-cells, each of which has a threshold voltage smaller than or equal to the first default read voltage, among the first memory cells when the first default read voltage is applied to the word lines and threshold voltages of the first memory cells are not scattered.

In an example embodiment, modifying the first default read voltage based on the first ratio and the first reference value corresponding to the first default read voltage may include decreasing the first default read voltage when the first ratio is bigger than the first reference value.

In an example embodiment, modifying the first default read voltage based on the first ratio and the first reference value corresponding to the first default read voltage may include increasing the first default read voltage when the first ratio is smaller than the first reference value.

In an example embodiment, the method may further include applying a second default read voltage included in the default read voltages to the word lines, and measuring a second ratio of second on-cells, each of which has a threshold voltage smaller than or equal to the second default read voltage, among the first memory cells, and modifying the second default read voltage based on the second ratio and a second reference value corresponding to the second default read voltage.

In an example embodiment, the non-volatile memory device may further include a plurality of second memory cells, each of which stores a plurality of data bits as one of the threshold voltages corresponding to the logic states.

In an example embodiment, the method may further include programming a second data to the second memory cells so that the logic states of the second memory cells are equally used, applying a second default read voltage included in the default read voltages to word lines coupled to the second memory cells, and measuring a second ratio of second on-cells, each of which has a threshold voltage smaller than or equal to the second default read voltage, among the second memory cells, and modifying the second read voltage based on the second ratio and a second reference value corresponding to the second default read voltage. A level of the first default read voltage may be the same as a level of the second default read voltage, and a level of the modified first default read voltage may be different from a level of the modified second default read voltage.

According to example embodiments, a method of reading data of a non-volatile memory device which includes a plurality of memory cells, each of which stores a plurality of data bits as one of a plurality of threshold voltages corresponding to a plurality of logic states, includes programming a first data to the memory cells so that the logic states of the memory cells are equally used, reading a data stored in the memory cells as a second data based on default read voltages, applying a first default read voltage included in the default read voltages to word lines coupled to the memory cells, and measuring a first ratio of first on-cells, each of which has a threshold voltage smaller than or equal to the first default read voltage, among the memory cells, correcting errors included in the second data based on an error correction code, outputting the first data corrected from the second data as a read data of the memory cells when the correction of the errors included in the second data succeeds, and modifying the first read voltage based on the first ratio and a first reference value corresponding to the first default read voltage and reading the data stored in the memory cell as a third data based on the default read voltages including the modified first default read voltages when the correction of the errors included in the second data fails.

In an example embodiment, the method may further include correcting errors included in the third data based on the error correction code, outputting the first data corrected from the third data as the read data of the memory cells when the correction of the errors included in the third data succeeds, and reading another data stored in the memory cells based on the default read voltages including the modified first default read voltage when the correction of the errors included in the third data succeeds.

In an example embodiment, the method may further include, when the correction of the errors included in the third data fails, repeating modifying (re-modifying) the first default read voltage and reading the data stored in the memory cell as the third data based on the default read voltages including the re-modified first default read voltage until the correction of the errors included in the third data succeeds.

In an example embodiment, the method may further include, when the correction of the errors included in the third data fails, applying a second default read voltage included in the default read voltages to the word lines, measuring a second ratio of second on-cells, each of which has a threshold voltage smaller than or equal to the second default read voltage, among the memory cells, modifying the second default read voltage based on the second ratio and a second reference value corresponding to the second default read voltage, and reading the data stored in the memory cell as the third data based on the default read voltages including the modified second default read voltage.

In an example embodiment, reading the data stored in the memory cells as the second data based on the default read voltages and applying the first default read voltage included in the default read voltages to the word lines coupled to the memory cells may be performed simultaneously.

According to example embodiments, a non-volatile memory device includes a memory cell array, a control circuit, a voltage generation circuit, an address decoder, and a data I/O circuit. The memory cell array includes a plurality of first memory cells, each of which stores a plurality of data bits as one of a plurality of threshold voltages corresponding to a plurality of logic states. The control circuit generates a row address signal and a column address signal based on a command signal and an address signal. The voltage generation circuit generates a first default read voltage based on a first default read voltage control signal. The address decoder applies the first default read voltage to a first word line corresponding to the row address signal when the command signal is a read command signal of the first memory cells. The data I/O circuit includes a page buffer. The page buffer receives a data stored in memory cells coupled to the first word line through a plurality of bit lines in response to the column address signal, extracts a first read data from the received data, and measures a first ratio of first on-cells, each of which has a threshold voltage smaller than or equal to the first default read voltage, among the first memory cells based on the received data. A first data is programmed to the first memory cells so that the logic states of the first memory cells are equally used. The control circuit includes a read voltage controller. The read voltage controller generates the first default read voltage control signal, which modifies the first default read voltage, based on the first ratio and a first reference value corresponding to the first default read voltage when a result of correction of errors included in the first read data represents a failure.

In an example embodiment, a memory controller included in the non-volatile memory device may generate the result of the correction based on the first read data.

In an example embodiment, the non-volatile memory device may further include an error corrector configured to generate the result of the correction based on the first read data and an error correction code.

In an example embodiment, the read voltage controller may generate the first default read voltage control signal to decrease the first default read voltage when the first ratio is greater than the first reference value.

In an example embodiment, the read voltage controller may generate the first default read voltage control signal to increase the first default read voltage when the first ratio is less than the first reference value.

In an example embodiment, the memory cell array may further include a plurality of second memory cells, each of which stores a plurality of data bits as one of the threshold voltages corresponding to the logic states. The voltage generation circuit generates a second default read voltage based on a second default read voltage control signal. The address decoder may apply the second default read voltage to a second word line corresponding to the row address signal when the command signal is a read command signal of the second memory cells. The page buffer may receive a data stored in memory cells coupled to the second word line through the plurality of bit lines in response to the column address signal, extract a second read data from the received data, and measure a second ratio of second on-cells, each of which has a threshold voltage smaller than or equal to the second default read voltage, among the second memory cells based on the received data. A second data may be programmed to the second memory cells so that the logic states of the second memory cells are equally used. The read voltage controller may generate the second default read voltage control signal, which modifies the second default read voltage, based on the second ratio and a second reference value corresponding to the second default read voltage when a result of correction of errors included in the second read data represents a failure. A level of the first default read voltage may be the same as a level of the second default read voltage, and a level of the modified first default read voltage may be different from a level of the modified second default read voltage.

In an example embodiment, the read voltage controller may include a first register storing a level of the first default read voltage control signal.

In an example embodiment, the read voltage controller may include a second register storing a level of the second default read voltage control signal.

As described above, the method of determining the default read voltage of the non-volatile memory device and the method of reading data of the non-volatile memory device may determine the default read voltage to reduce or minimize read errors, and may reduce the number of read retry compared to a conventional approach.

BRIEF DESCRIPTION OF THE DRAWINGS

Example embodiments of the inventive concept will be more clearly understood from the following detailed description taken in conjunction with the accompanying drawings.

FIG. 2 is a flow chart illustrating modifying the first default read voltage based on the first ratio and the first reference value corresponding to the first default read voltage included in the flow chart of FIG. 1.

FIG. 3 is a flow chart illustrating another method of determining the default read voltage of the non-volatile memory device according to another example embodiment.

FIGS. 9 through 11 are graphs illustrating threshold voltages of the first memory cells included in the memory cell array of FIG. 7A.

FIGS. 12A and 12B are diagrams illustrating data stored in memory cells included in the memory cell array of FIG. 7A.

DETAILED DESCRIPTION OF THE EMBODIMENTS

Figure 1:
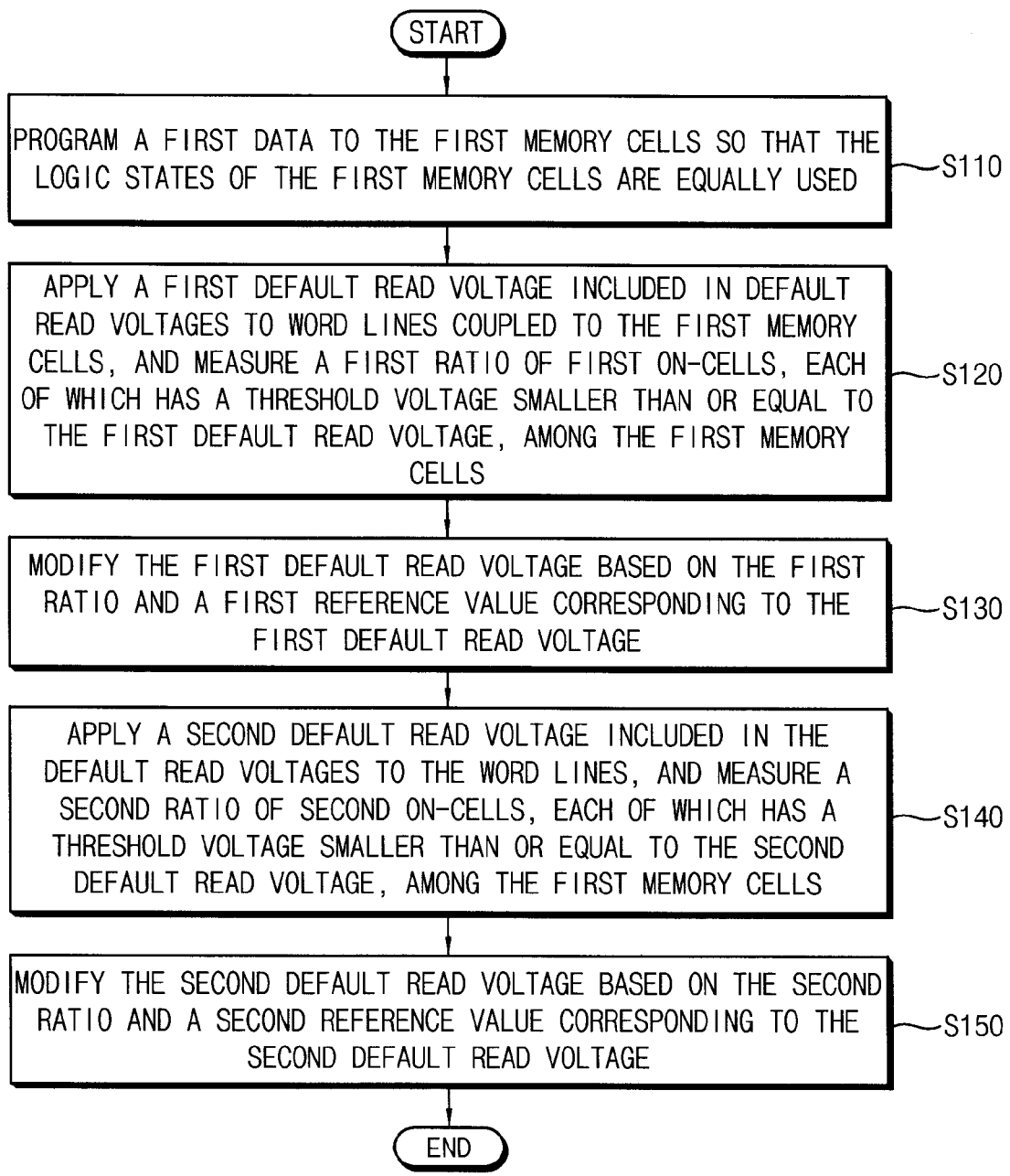
FIG. 1 is a flow chart illustrating a method of determining a default read voltage of a non-volatile memory device according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of determining a default read voltage of a non-volatile memory device according to an example embodiment. Referring to FIG. 1, a non-volatile memory device includes a plurality of first memory cells, each of which is configured to store a plurality of data bits as one of a plurality of threshold voltages corresponding to a plurality of logic states. A method of determining a default read voltage of the non-volatile memory device includes programming a first data to the first memory cells so that the logic states of the first memory cells are balanced or equally used (S110). Programming the first data to the first memory cells (S110) will be described with reference to FIGS. 8A, 8B, 12A, and 12B.

The method of determining the default read voltage of the non-volatile memory device includes applying a first default read voltage included in default read voltages to word lines coupled to the first memory cells, and measuring a first ratio of first on-cells, each of which has a threshold voltage smaller than or equal to the first default read voltage, among the first memory cells (S120). Applying the first default read voltage included in the default read voltages to the word lines coupled to the first memory cells (S120) will be described with reference to FIGS. 10, 11, 14, and 15.

The method of determining the default read voltage of the non-volatile memory device includes modifying the first default read voltage based on the first ratio and a first reference value corresponding to the first default read voltage (S130). Modifying the first default read voltage based on the first ratio and the first reference value corresponding to the first default read voltage (S130) will be described with reference to FIGS. 9, 11, and 13 through 15.

The method of determining the default read voltage of the non-volatile memory device may further include applying a second default read voltage included in the default read voltages to the word lines, and measuring a second ratio of second on-cells, each of which has a threshold voltage smaller than or equal to the second default read voltage, among the first memory cells (S140), and modifying the second default read voltage based on the second ratio and a second reference value corresponding to the second default read voltage (S150). The steps (S140 and S150) will be described with reference to FIGS. 11 and 15.

FIG. 2 is a flow chart illustrating modifying the first default read voltage based on the first ratio and the first reference value corresponding to the first default read voltage included in the flow chart of FIG. 1.

Referring to FIG. 2, modifying the first default read voltage based on the first ratio and the first reference value corresponding to the first default read voltage (S130) may include decreasing the first default read voltage when the first ratio is greater than the first reference value (S131) and increasing the first default read voltage when the first ratio is smaller than the first reference value (S132). The steps (S131 and S132) will be described with reference to FIGS. 11 and 15.

FIG. 3 is a flow chart illustrating another method of determining the default read voltage of the non-volatile memory device according to another example embodiment. Referring to FIG. 3, the non-volatile memory device of FIG. 1 may further include a plurality of second memory cells, each of which is configured to store a plurality of data bits as one of the threshold voltages corresponding to the logic states.

Another method of determining the default read voltage of the non-volatile memory device may include the same steps (S110, S120, and S130). The another method may further include programming a second data to the second memory cells so that the logic states of the second memory cells are balanced or equally used (S160), applying a second default read voltage included in the default read voltages to word lines coupled to the second memory cells, and measuring a second ratio of second on-cells, each of which has a threshold voltage smaller than or equal to the second default read voltage, among the second memory cells (S170), and modifying the second read voltage based on the second ratio and a second reference value corresponding to the second default read voltage (S180).

Before modifying the first read voltage (S130) and modifying the second read voltage (S180), a level of the first default read voltage may be the same as a level of the second default read voltage. After modifying the first read voltage (S130) and modifying the second read voltage (S180), a level of the modified first default read voltage may be different from a level of the modified second default read voltage.

Figure 4A:
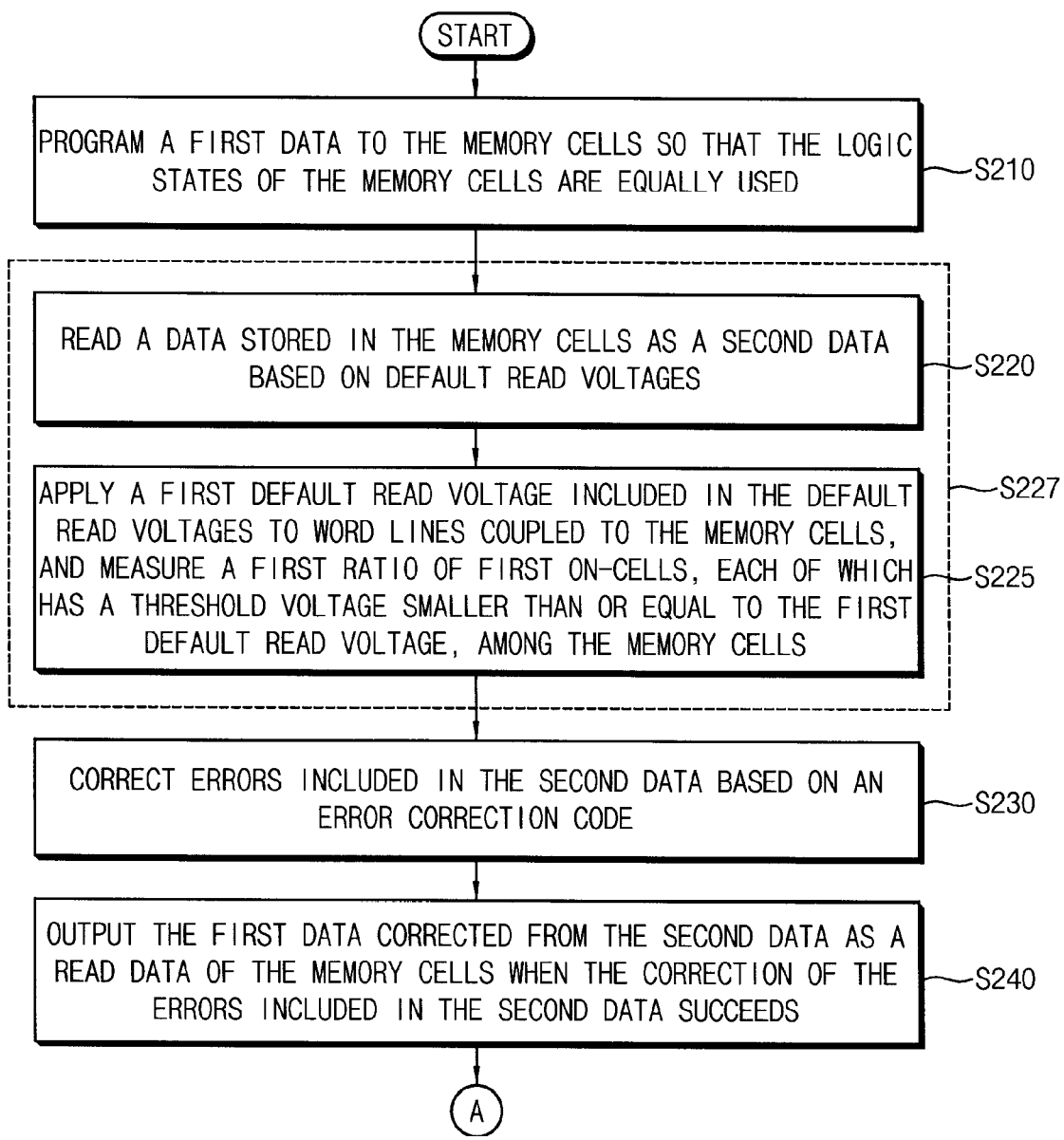
FIGS. 4A and 4B, and 5A and 5B are flow charts illustrating methods of reading data of the non-volatile memory device according to example embodiments.
Figure 4B:
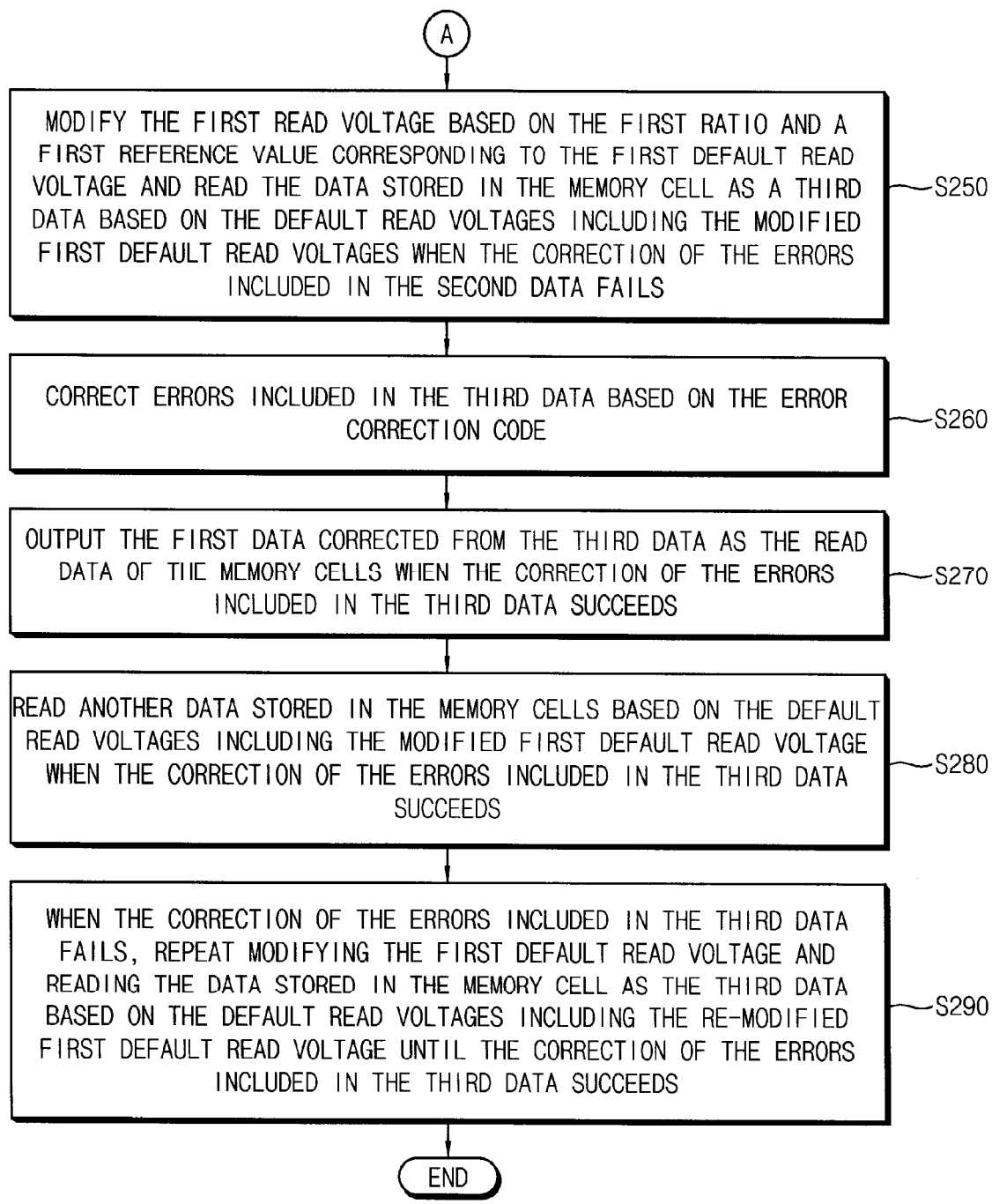

FIGS. 4A and 4B and FIGS. 5A and 5B are flow charts illustrating methods of reading data of the non-volatile memory device according to example embodiments. Referring to FIGS. 4A and 4B, a non-volatile memory device includes a plurality of memory cells, each of which is configured to store a plurality of data bits as one of a plurality of threshold voltages corresponding to a plurality of logic states. A method of reading data of the non-volatile memory device includes programming a first data to the memory cells so that the logic states of the memory cells are balanced or equally used (S210). Programming the first data to the memory cells (S210) will be described with reference to FIGS. 8A, 8B, 12A, and 12B.

The method of reading data of the non-volatile memory device includes reading a data stored in the memory cells as a second data based on default read voltages (S220) and applying a first default read voltage included in the default read voltages to word lines coupled to the memory cells, and measuring a first ratio of first on-cells, each of which has a threshold voltage smaller than or equal to the first default read voltage, among the memory cells (S225). Because of threshold voltage distribution, the second data includes the first data programmed to the memory cells and read errors. Threshold voltage distribution of the memory cells will be described with reference to FIGS. 10 and 14. Applying the first default read voltage included in the default read voltages to the word lines coupled to the memory cells (S225) will be described with reference to FIGS. 9, 10, 13, and 14.

Reading the data stored in the memory cells as the second data based on the default read voltages (S220) and applying the first default read voltage included in the default read voltages to the word lines coupled to the memory cells (S225) may be performed simultaneously (S227).

The method of reading data of the non-volatile memory device includes correcting errors included in the second data based on an error correction code (S230). In an example embodiment, correcting the errors included in the second data based on the error correction code (S230) may be performed on an error corrector included in the non-volatile memory device. The error corrector may check whether the second data includes uncorrectable errors or not based on parity bits included in the second data. If the second data includes the uncorrectable errors, the error corrector may fail to correct the errors. If the second data does not include the uncorrectable errors, the error corrector may succeed to correct the errors, and may restore the first data from the second data.

In another example embodiment, correcting the errors included in the second data based on the error correction code (S230) may be performed on a memory controller coupled to the non-volatile memory device. The memory controller may check whether the second data includes uncorrectable errors or not based on the parity bits included in the second data. If the second data includes the uncorrectable errors, the memory controller may fail to correct the errors. If the second data does not include the uncorrectable errors, the memory controller may succeed to correct the errors, and may restore the first data from the second data.

The method of reading data of the non-volatile memory device may include outputting the first data corrected from the second data as a read data of the memory cells when the correction of the errors included in the second data succeeds (S240), and modifying the first read voltage based on the first ratio and a first reference value corresponding to the first default read voltage and reading the data stored in the memory cell as a third data based on the default read voltages including the modified first default read voltage when the correction of the errors included in the second data fails (S250). The step (S250) will be described with reference to FIGS. 11 and 15.

In an example embodiment, outputting the first data corrected from the second data as the read data of the memory cells when the correction of the errors included in the second data succeeds (S240) may include modifying the first default read voltage based on the first ratio and a first reference value corresponding to the first default read voltage, even if the correction of the errors included in the second data succeeds.

After the steps (S240 and S250) are performed, the modified first default read voltage may be used in a later reading operation.

The method of reading data of the non-volatile memory device may further include correcting errors included in the third data based on the error correction code (S260), outputting the first data corrected from the third data as the read data of the memory cells when the correction of the errors included in the third data succeeds (S270), and reading another data stored in the memory cells based on the default read voltages including the modified first default read voltage when the correction of the errors included in the third data succeeds (S280). The method of reading data of the non-volatile memory device may further include, when the correction of the errors included in the third data fails, repeating modifying (re-modifying) the first default read voltage and reading the data stored in the memory cell as the third data based on the default read voltages including the re-modified first default read voltage until the correction of the errors included in the third data succeeds (S290).

Figure 5A:
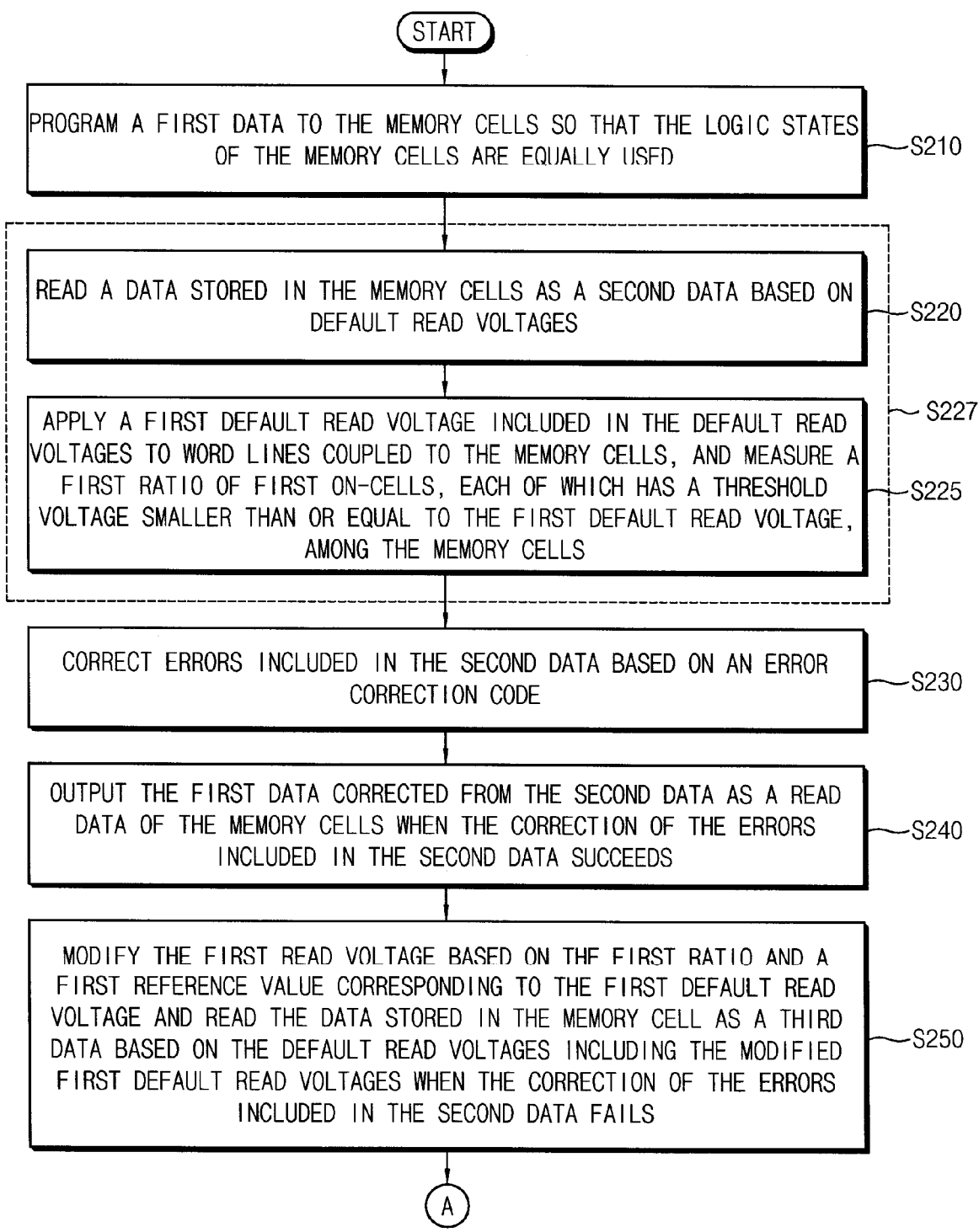
Figure 5B:
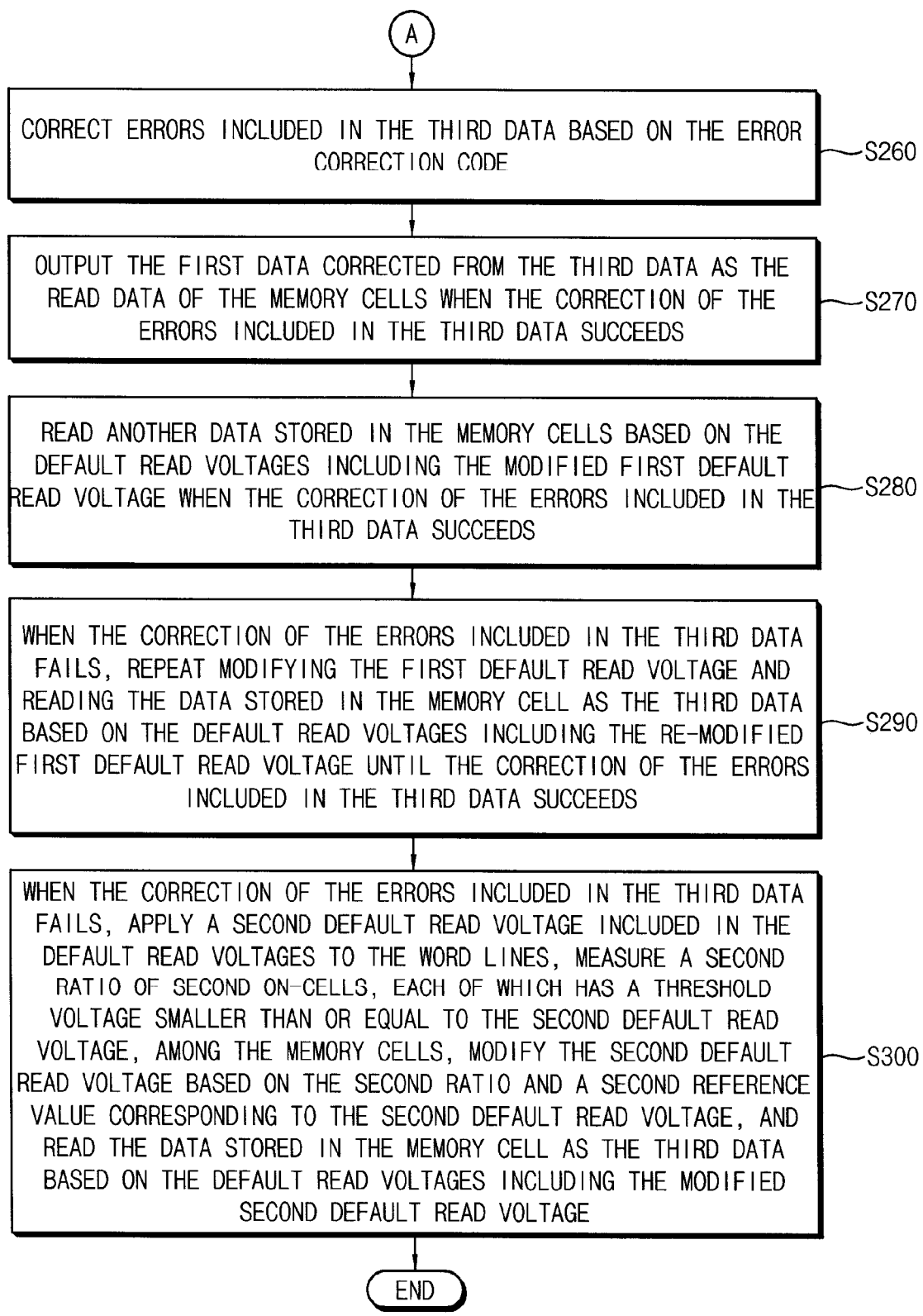

Referring to FIGS. 5A and 5B, a method of reading data of the non-volatile memory device may include the same steps (S210 through S290) included in the flow chart of FIGS. 4A and 4B FIG. 1, and when the correction of the errors included in the third data fails, applying a second default read voltage included in the default read voltages to the word lines, measuring a second ratio of second on-cells, each of which has a threshold voltage smaller than or equal to the second default read voltage, among the memory cells, modifying the second default read voltage based on the second ratio and a second reference value corresponding to the second default read voltage, and reading the data stored in the memory cell as the third data based on the default read voltages including the modified second default read voltage (S300). In other words, to read the data stored in the memory cell without errors, the default read voltages including the first default read voltage and the second default read voltage may be modified sequentially.

Figure 6:
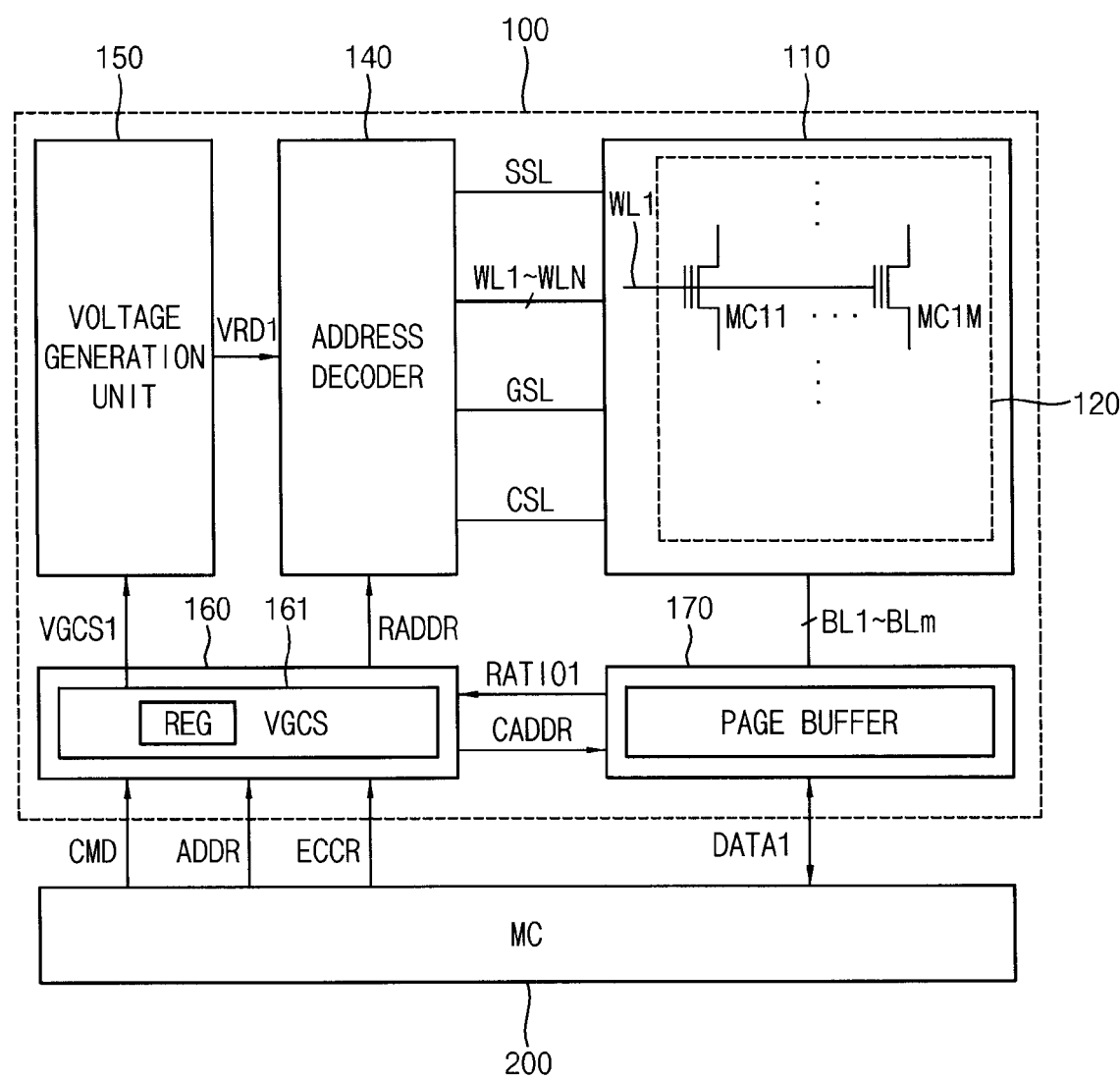
FIG. 6 is a block diagram illustrating a memory system including a non-volatile memory device according to an example embodiment.

FIG. 6 is a block diagram illustrating a memory system including a non-volatile memory device according to an example embodiment. Referring to FIG. 6, a non-volatile memory device 100 includes a memory cell array 110, a control circuit 160, a voltage generation circuit 150, an address decoder 140, and a data I/O circuit 170. The data I/O circuit 170 includes a page buffer PAGE BUFFER.

The memory cell array 110 includes a plurality of first memory cells 120. Each of the first memory cells 120 stores a plurality of data bits as one of a plurality of threshold voltages corresponding to a plurality of logic states. The control circuit 160 generates a row address signal RADDR and a column address signal CADDR based on a command signal CMD and an address signal ADDR. The voltage generation circuit 150 generates a first default read voltage VRD1 based on a first default read voltage control signal VGCS1. The address decoder 140 applies the first default read voltage VRD1 to a first word line WL1 from among word lines WL1 through WLN corresponding to the row address signal RADDR when the command signal CMD is a read command signal of the first memory cells 120. The page buffer PAGE BUFFER receives a data stored in memory cells MC11 through MC1M coupled to the first word line WL1 through a plurality of bit lines BL1 through BLM in response to the column address signal CADDR, extracts a first read data DATA1 from the received data, and measures a first ratio RATIO1 of first on-cells, each of which has a threshold voltage smaller than or equal to the first default read voltage VRD1, among the first memory cells 120 based on the received data.

The page buffer PAGE BUFFER may execute extraction of the first read data DATA1 and measurement of the first ratio RATIO1 simultaneously.

A first data is programmed to the first memory cells 120 so that the logic states of the first memory cells 120 are balanced or equally used. Detailed description of this case will be described with reference to FIGS. 8A, 8B, 12A, and 12B.

A memory controller 200 may generate the result of the correction ECCR of errors included in the first read data DATA1 based on the first read data DATA1. The memory controller 200 may check whether the first read data DATA1 includes uncorrectable errors or not based on the parity bits included in the first read data DATA1. If the first read data DATA1 includes the uncorrectable errors, the memory controller 200 may fail to correct the errors. If the first read data DATA1 does not include the uncorrectable errors, the memory controller 200 may succeed to correct the errors, and may restore an original programmed data from the first read data DATA1.

The control circuit 160 includes a read voltage controller 161. The read voltage controller 161 may include a first register REG storing a level of the first default read voltage control signal VGCS1.

The read voltage controller 161 generates the first default read voltage control signal VGCS1, which modifies the first default read voltage VRD1, based on the first ratio RATIO1 and a first reference value corresponding to the first default read voltage VRD1 when a result of correction ECCR of errors included in the first read data DATA1 represents a failure. In an example embodiment, the read voltage controller 161 may generate the first default read voltage control signal VGCS1 to decrease the first default read voltage VRD1 when the first ratio RATIO1 is bigger than the first reference value. In another example embodiment, the read voltage controller 161 may generate the first default read voltage control signal VGCS1 to increase the first default read voltage VRD1 when the first ratio RATIO1 is smaller than the first reference value. The first reference value corresponding to the first default read voltage VRD1 and operation of the read voltage controller 161 will be described with reference to FIGS. 9, 11, 13 through 15.

Figure 7A:
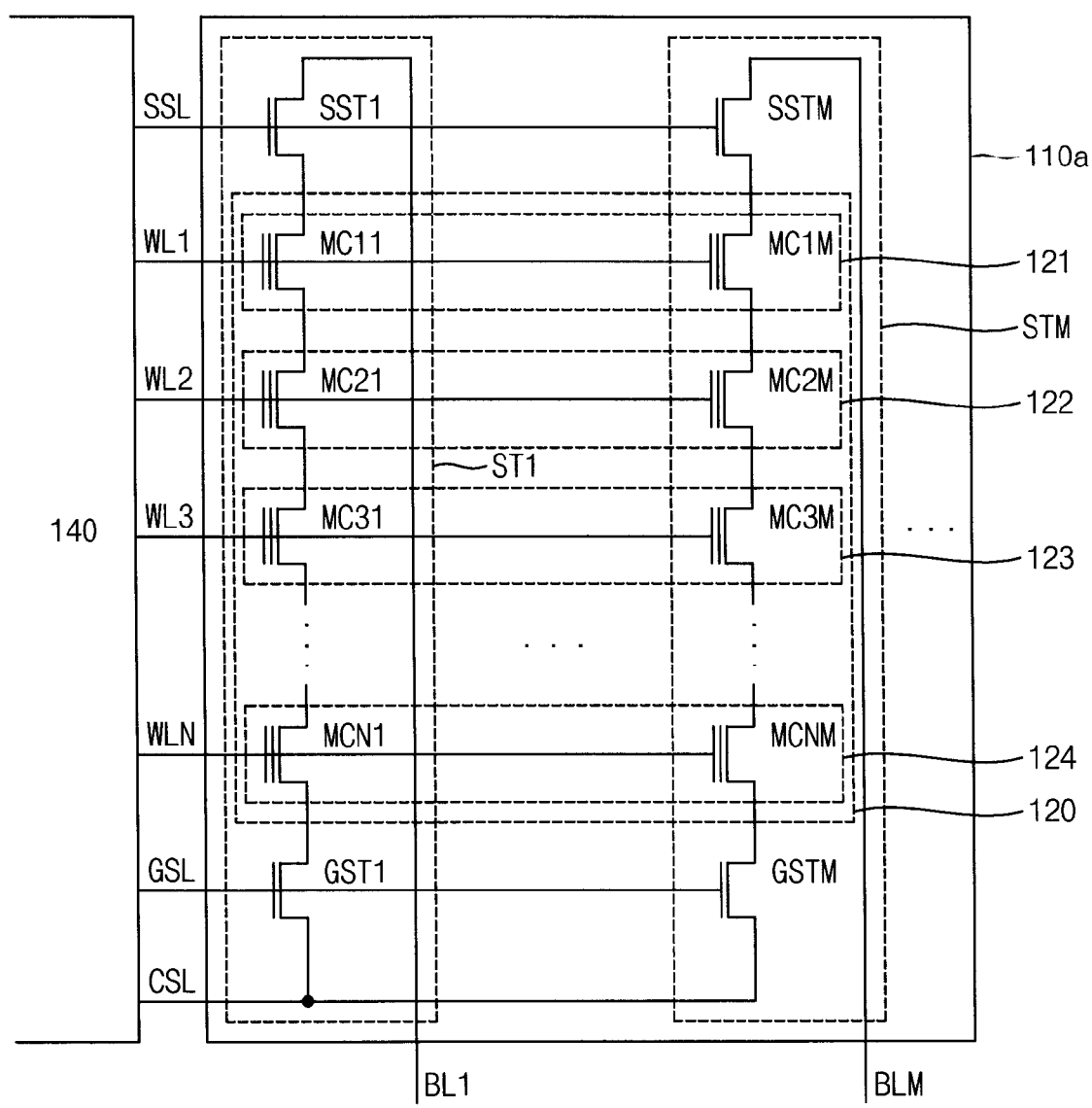
FIG. 7A is a block diagram illustrating an example embodiment of the memory cell array included in the memory system of FIG. 6 as implemented with a 2-D or planar structure.

FIG. 7A is a block diagram illustrating an example embodiment of the memory cell array included in the memory system of FIG. 6 as implemented with a planar or 2-D structure.

Referring to FIG. 7A, the memory cell array 110 includes the first memory cells 120. The first memory cells 120 include memory cells 121 coupled to the first word line WL1, memory cells 122 coupled to the second word line WL2, memory cells 123 coupled to the third word line WL3, and memory cells 124 coupled to the (N)-th word line WLN.

The memory cells 121 coupled to the first word line WL1 include M memory cells MC11 through MC1M. The memory cells 122 coupled to the second word line WL2 include M memory cells MC21 through MC2M. The memory cells 123 coupled to the third word line WL3 include M memory cells MC31 through MC3M. The memory cells 124 coupled to the (N)-th word line WLN include M memory cells MCN1 through MCNM. Data stored in the memory cells 121 coupled to the first word line WL1 will be described with reference to FIGS. 8A, 8B, 12A, and 12B.

In an example embodiment, each of the first memory cells 120 included in the memory cell array 110 may be a single-level cell (SLC) storing a data bit. In another example embodiment, each of the first memory cells 120 included in the memory cell array 110 may be a multi-level cell (MLC) storing two data bits. In still another example embodiment, each of the first memory cells 120 included in the memory cell array 110 may be a triple-level cell (TLC) storing three data bits.

The memory cell array 110a includes the first cell string ST1 through the (M)-th cell string STM. The first cell string ST1 may be connected between the first bit line BL1 and the common source line CSL. The (M)-th cell string STM may be connected between the (M)-th bit line BLM and the common source line CSL.

The first cell string ST1 may include the first string selection transistor SST1, the first memory cell MC11, the third memory cell MC21, the fifth memory cell MC31, the seventh memory cell MCN1, and the first ground selection transistor GST1. A gate terminal of the first string selection transistor SST1 may be connected to the string selection line SSL. A gate terminal of the first ground selection transistor GST1 may be connected to the ground selection line GSL. The first word line WL1 may be connected to the first memory cell MC11, the second word line WL2 may be connected to the third memory cell MC21, the third word line WL3 may be connected to the fifth memory cell MC31, and the (N)-th word line WLN may be connected to the seventh memory cell MCN1.

The (M)-th cell string STM may include the (M)-th string selection transistor SSTM, the second memory cell MC1M, the fourth memory cell MC2M, the sixth memory cell MC3M, the eighth memory cell MCNM, and the (M)-th ground selection transistor GSTM. A gate terminal of the (M)-th string selection transistor SSTM may be connected to the string selection line SSL. A gate terminal of the (M)-th ground selection transistor GSTM may be connected to the ground selection line GSL. The first word line WL1 may be connected to the second memory cell MC1M, the second word line WL2 may be connected to the fourth memory cell MC2M, the third word line WL3 may be connected to the sixth memory cell MC3M, and the (N)-th word line WLN may be connected to the eighth memory cell MCNM.

If the second word line WL2 is selected in read operation, the first default read voltage is applied to the second word line WL2, and a maximum read voltage is applied to unselected word lines WL1, WL3, and WLN.

The first default read voltage may be for detecting threshold voltages of the memory cells MC21 through MC2M coupled to the selected second word line WL2. A level of the first default read voltage may be between threshold voltage distributions of the memory cells MC21 through MC2M coupled to the selected second word line WL2. The maximum read voltage may be for turning-on the memory cells MC11, MC1M, MC31, MC3M, MCN1, MCNM coupled to the unselected word lines WL1, WL3, and WLN. The maximum read voltage may be bigger than threshold voltages of the memory cells MC11, MC1M, MC31, MC3M, MCN1, and MCNM. The maximum read voltage may be bigger than the first default read voltage.

Figure 7B:
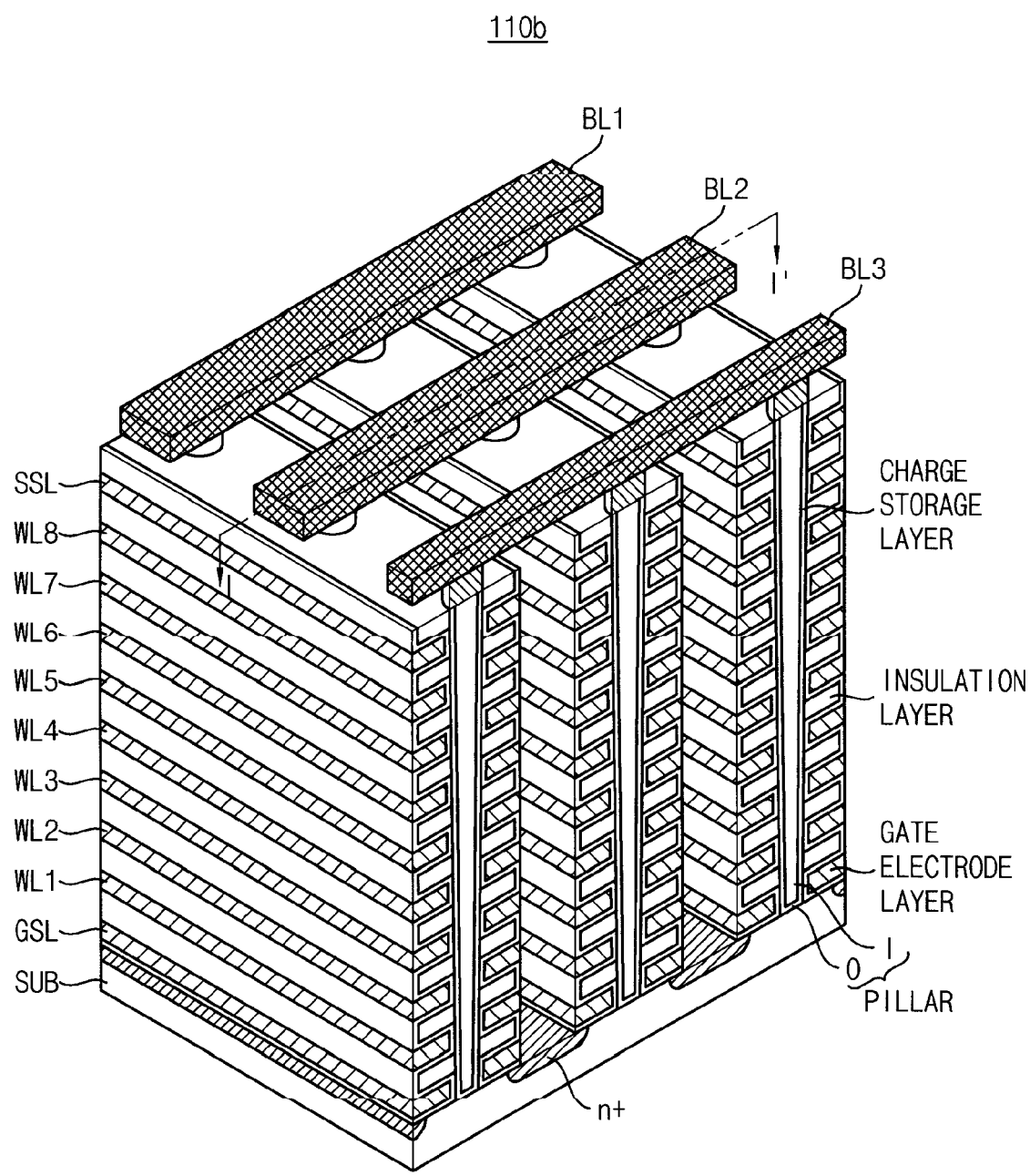
FIG. 7B is a perspective view illustrating an example embodiment of the memory cell array included in the memory system of FIG. 6 as implemented with a 3-D structure.

FIG. 7B is a perspective view illustrating an example embodiment of the memory cell array included in the memory system of FIG. 6 as implemented with a 3-D structure. Referring to FIG. 7B, a memory cell array 110b may be formed in a direction perpendicular to a substrate SUB. An n+ doped region may be formed in the substrate SUB. A gate electrode layer and an insulation layer may be alternately deposited on the substrate SUB. Also, a charge storage layer may be formed between the gate electrode layer and the insulation layer.

When the gate electrode layer and the insulation layer are vertically patterned, a V-shaped pillar may be formed. The pillar may penetrate the gate electrode layer and the insulation layer to be connected to the substrate SUB. The outer portion O of the pillar may be configured with a channel semiconductor, and the inner portion I of the pillar may be configured with an insulation material such as silicon oxide.

The gate electrode layer may be connected to the ground selection line GSL, the plurality of word lines WL1 to WL8, and the string selection line SSL. The pillar may be connected to the plurality of bit lines BL1 to BL3.

It is illustrated in FIG. 7B, that the memory cell array 110b has the ground selection line GSL, the string selection line SSL, eight word lines WL1 to WL8, and three bit lines BL1 to BL3 as an example, but embodiments are not limited thereto.

Figure 7C:
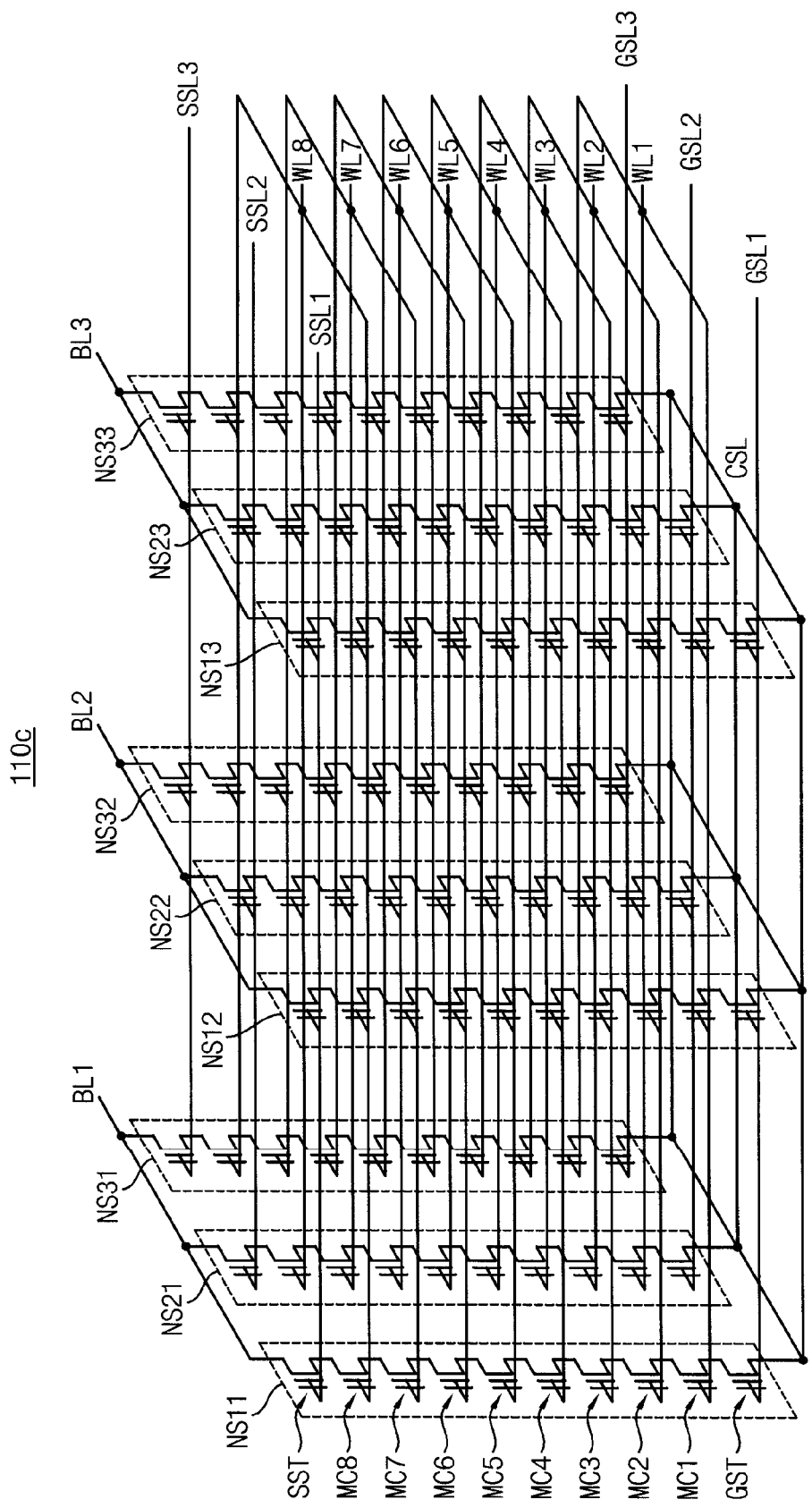
FIG. 7C is a circuit diagram illustrating an equivalent circuit of the memory cell array of FIG. 7A.

FIG. 7C is a circuit diagram illustrating an equivalent circuit of the memory cell array of FIG. 7A. Referring to FIG. 7C, NAND strings NS11 to NS33 may be connected between the bit lines BL1 to BL3 and a common source line CSL. Each NAND string (e.g., NS11) may include a string selection transistor SST, a plurality of memory cells MC1 to MC8, and a ground selection transistor GST.

The string selection transistor SST may be connected to string selection lines SSL1 to SSL3. The plurality of memory cells MC1 to MC8 may be connected to corresponding word lines WL1 to WL8, respectively. The ground selection transistor GST may be connected to ground selection lines GSL1 to GSL3. The string selection transistor SST may be connected to the bit lines BL1 to BL3, and the ground selection transistor GST may be connected to the common source line CSL.

Word lines (e.g., WL1) having the same height may be commonly connected and the ground selection lines GSL1 to GSL3 and the string selection lines SSL1 to SSL3 may be separated. For example, when a physical page that includes memory cells connected to the first word line WL1 and included in the NAND strings NS11, NS12, and NS13 is programmed, the first word line WL1, the first string selection lines SSL1, and the first ground selection line GSL1 may be selected.

Figure 8A:
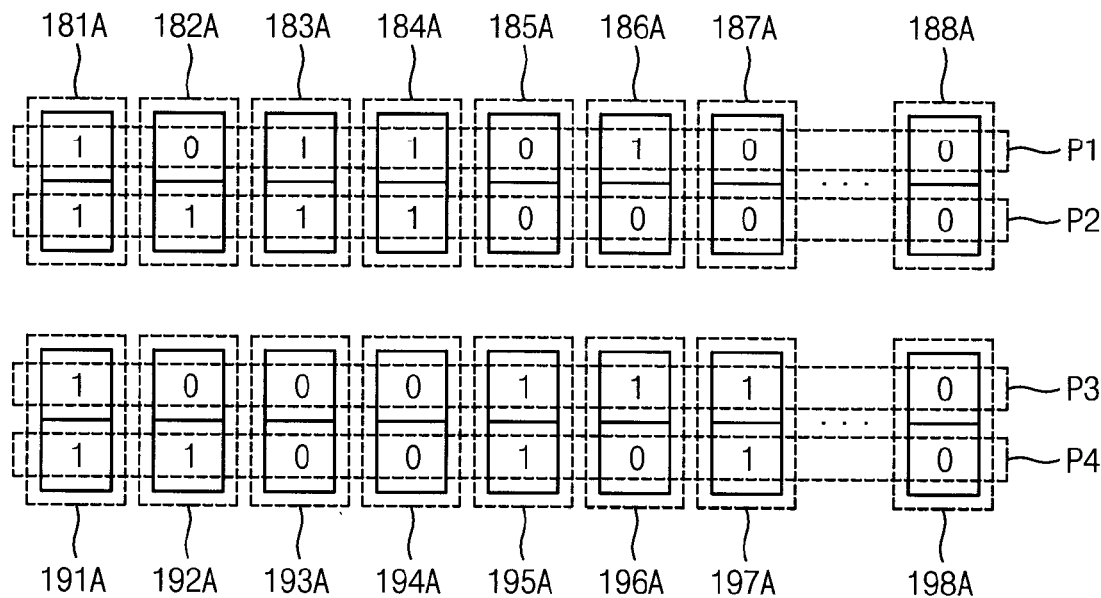
FIGS. 8A and 8B are diagrams illustrating data stored in memory cells included in the memory cell array of FIG. 7A.
Figure 8B:
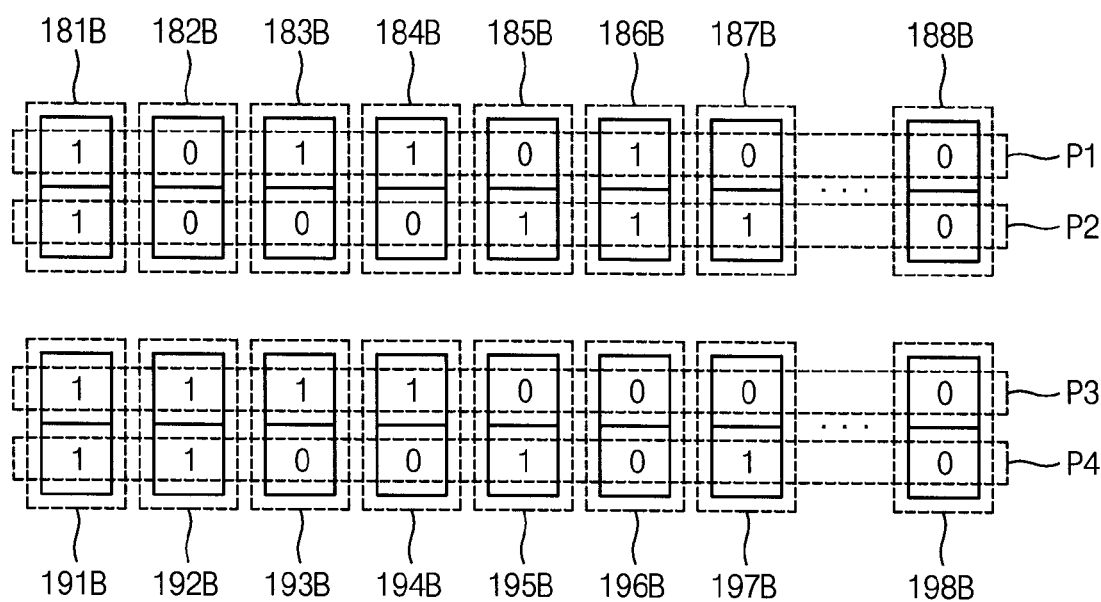

FIGS. 8A and 8B are diagrams illustrating data stored in memory cells included in the memory cell array of FIG. 7A. FIGS. 8A and 8B show a case where each of the memory cells included in the memory cell array 110 is a multi-level cell (MLC) storing 2 bits.

FIG. 8A shows a case where data is stored to the memory cell array 110 so that logic states of the memory cells included in the memory cell array 110 are not balanced or equally used. The memory cells 121 coupled to the first word line WL1 included in the memory cell array 110 of FIG. 7A includes the first through eighth memory cells. The memory cells 122 coupled to the second word line WL2 included in the memory cell array 110 of FIG. 7A includes the ninth through sixteenth memory cells.

Most significant bits (MSB) of the memory cells 121 coupled to the first word line WL1 form a first page P1. Least significant bits (LSB) of the memory cells 121 coupled to the first word line WL1 form a second page P2. Most significant bits of the memory cells 122 coupled to the second word line WL2 form a third page P3. Least significant bits of the memory cells 122 coupled to the second word line WL2 form a fourth page P4. In FIG. 8A, the first page P1 includes 10110100, the second page P2 includes 11110000, the third page P3 includes 10001110, and the fourth page P4 includes 11001010.

In an example embodiment, each of the first memory cells 120 may have a first logic state, a second logic state, a third logic state, or a fourth logic state. In the first memory cell MC11, the first logic state indicates that the first memory cell MC11 stores 11'b, the second logic state indicates that the first memory cell MC11 stores 01'b, the third logic state indicates that the first memory cell MC11 stores 00'b, and the fourth logic state indicates that the first memory cell MC11 stores 10'b.

In FIG. 8A, the first memory cell includes 11'b (181A) and has the first logics state. The second memory cell includes 01'b (182A) and has the second logics state. The third memory cell includes 11'b (183A) and has the first logic state. The fourth memory cell includes 11'b (184A) and has the first logic state. The fifth memory cell includes 00'b (185A) and has the third logic state. The sixth memory cell includes 10'b (186A) and has the fourth logic state. The seventh memory cell includes 00'b (187A) and has the third logic state. The eighth memory cell includes 00'b (188A) and has the third logic state. The ninth memory cell includes 11'b (191A) and has the first logic state. The tenth memory cell includes 01'b (192A) and has the second logic state. The eleventh memory cell includes 00'b (193A) and has the third logic state. The twelfth memory cell includes 00'b (194A) and has the third logic state. The thirteenth memory cell includes 11'b (195A) and has the first logic state. The fourteenth memory cell includes 10'b (196A) and has the fourth logic state. The fifteenth memory cell includes 11'b (197A) and has the first logic state. The sixteenth memory cell includes 00'b (198A) and has the third logic state.

In FIG. 8A, the first logic state is used 6 times, the second logic state is used 2 times, the third logic state is used 6 times, and the fourth logic state is used 2 times. In FIG. 8A, logic states of the memory cells are not balanced or equally used.

FIG. 8B shows a case where data is stored to the memory cell array 110 so that logic states of the memory cells included in the memory cell array 110 are balanced or equally used. The first page P1 of FIG. 8A is stored with most significant bits of the memory cells 121 coupled to the first word line WL1. The second page P2 of FIG. 8A is stored with most significant bits of the memory cells 122 coupled to the second word line WL2. The third page P3 of FIG. 8A is stored with least significant bits of the memory cells 121 coupled to the first word line WL1. The fourth page P4 of FIG. 8A is stored with least significant bits of the memory cells 122 coupled to the second word line WL2.

In FIG. 8B, the first memory cell includes 11'b (181B) and has the first logics state. The second memory cell includes 00'b (182B) and has the third logics state. The third memory cell includes 10'b (183B) and has the fourth logic state. The fourth memory cell includes 10'b (184B) and has the fourth logic state. The fifth memory cell includes 01'b (185B) and has the second logic state. The sixth memory cell includes 11'b (186B) and has the first logic state. The seventh memory cell includes 01'b (187B) and has the second logic state. The eighth memory cell includes 00'b (188B) and has the third logic state. The ninth memory cell includes 11'b (191B) and has the first logic state. The tenth memory cell includes 11'b (192B) and has the first logic state. The eleventh memory cell includes 10'b (193B) and has the fourth logic state. The twelfth memory cell includes 10'b (194B) and has the fourth logic state. The thirteenth memory cell includes 01'b (195B) and has the second logic state. The fourteenth memory cell includes 00'b (196B) and has the third logic state. The fifteenth memory cell includes 01'b (197B) and has the second logic state. The sixteenth memory cell includes 00'b (198B) and has the third logic state.

In FIG. 8B, the first logic state is used 4 times, the second logic state is used 4 times, the third logic state is used 4 times, and the fourth logic state is used 4 times. In FIG. 8B, logic states of the memory cells are balanced or equally used. The usage of the logic states of the memory cells may be controlled by modifying storing location as described above.

Figure 9:
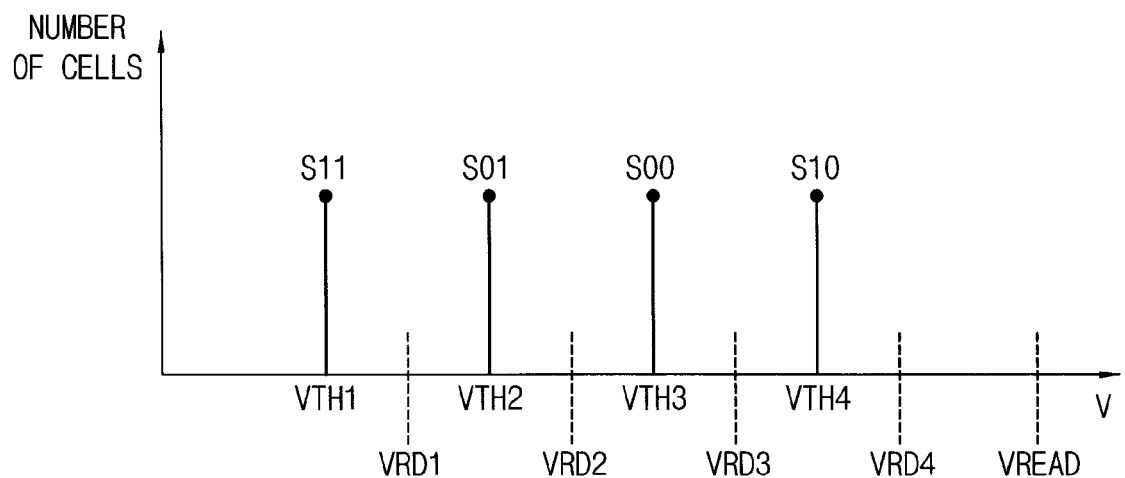
Figure 10:
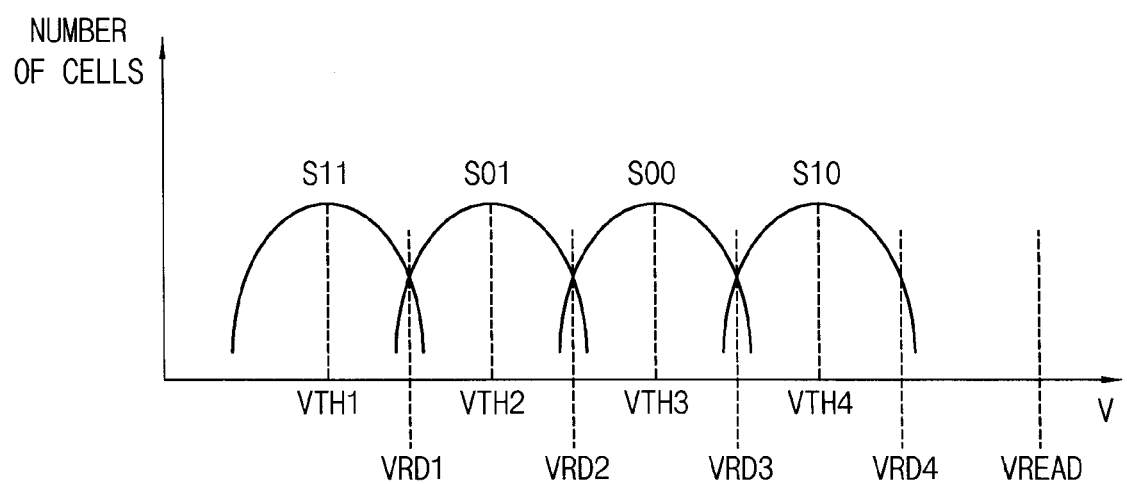

FIGS. 9 through 11 are graphs illustrating threshold voltages of the first memory cells included in the memory cell array of FIG. 7A. FIG. 9 shows a case where threshold voltages of the first memory cells 120 of FIG. 7 are not scattered.

The first memory cells 120 include a first memory cell. When the first memory cell has the first logic states S11, the first memory cell may be programmed with the first threshold voltage VTH1. When the first memory cell has the second logic state S01, the first memory cell may be programmed with the second threshold voltage VTH2. When the first memory cell has the third logic state S00, the first memory cell may be programmed with the third threshold voltage VTH3. When the first memory cell has the fourth logic state S10, the first memory cell may be programmed with the fourth threshold voltage VTH4. Each of the first memory cells 120 may be programmed in the same way as the first memory cell.

FIG. 9 shows a case where data is stored to the first memory cells 120 so that the logic states of the first memory cells 120 are equally used like FIG. 8B, and the first memory cells 120 are programmed with the first threshold voltage VTH1 through the fourth threshold voltage VTH4 corresponding to the logic states. When the first default read voltage VRD1 is applied to the first memory cells 120, memory cells, which have the first threshold voltage VTH1, among the first memory cells 120 become on-cells, and the first reference value corresponding to the first default read voltage VRD1 may be 1/4. When the second default read voltage VRD2 is applied to the first memory cells 120, memory cells, which have the first threshold voltage VTH1 or the second threshold voltage VTH2, among the first memory cells 120 become on-cells, and the second reference value corresponding to the second default read voltage VRD2 may be 2/4. When the third default read voltage VRD3 is applied to the first memory cells 120, memory cells, which have the first threshold voltage VTH1, the second threshold voltage VTH2, or the third threshold voltage VTH3, among the first memory cells 120 become on-cells, and the third reference value corresponding to the third default read voltage VRD3 may be 3/4. When the fourth default read voltage VRD4 is applied to the first memory cells 120, all of the first memory cells 120 become on-cells, and the fourth reference value corresponding to the fourth default read voltage VRD4 may be 1.

The maximum read voltage VREAD, which is applied to memory cells that are not target of reading, may have a bigger level than the first through fourth default read voltages VRD1, VRD2, VRD3, and VRD4.

FIG. 10 shows a case where data is stored to the first memory cells 120 so that the logic states of the first memory cells 120 are equally used like FIG. 8B, the first memory cells 120 are programmed with the first threshold voltage VTH1 through the fourth threshold voltage VTH4 corresponding to the logic states, and the threshold voltages of the first memory cells 120 are scattered because of a charge leakage, a program disturb, an electrical coupling, a change in temperature, a change in voltage etc. during a program operation or after a program operation. The first memory cells 120 programmed with the first through the fourth logic states S11, S01, S00, and S10 may have the first through the fourth threshold voltage distributions, respectively.

Unlike FIG. 9, when the first default read voltage VRD1 is applied to the first memory cells 120, memory cells, which are programmed as the first logic state S11 and have a threshold voltage smaller than or equal to the first default read voltage VRD1, become the first on-cells, memory cells, which are programmed as the first logic state S11 and have a threshold voltage bigger than the first default read voltage VRD1, become the first off-cells, and memory cells, which are programmed as the second logic state S01 and have a threshold voltage smaller than or equal to the first default read voltage VRD1, become the second on-cells. The first off-cells and the second on-cells may generate read errors. The read errors may be corrected based on the error correction code. The case where one of the second through the fourth default read voltages VRD2 through VRD4 is applied to the first memory cells 120 may be understood based on the description.

The first default read voltage VRD1 may be between the first threshold voltage distribution and the second threshold voltage distribution. If the first default read voltage VRD1 has a voltage of a point where the first threshold voltage distribution meets the second threshold voltage distribution, the read errors may be reduced or minimized. The second default read voltage VRD2 may be between the second threshold voltage distribution and the third threshold voltage distribution. If the second default read voltage VRD2 has a voltage of a point where the second threshold voltage distribution meets the third threshold voltage distribution, the read errors may be reduced or minimized. The third default read voltage VRD3 may be between the third threshold voltage distribution and the fourth threshold voltage distribution. If the third default read voltage VRD3 has a voltage of a point where the third threshold voltage distribution meets the fourth threshold voltage distribution, the read errors may be reduced or minimized.

FIG. 11 shows a case where data is stored to the first memory cells 120 so that the logic states of the first memory cells 120 are equally used like FIG. 8B, the first memory cells 120 are programmed with the first threshold voltage VTH1 through the fourth threshold voltage VTH4 corresponding to the logic states, and the threshold voltages of the first memory cells 120 are modified because of a charge leakage, a program disturb, an electrical coupling, a change in temperature, a change in voltage etc. during a program operation or after a program operation.

The first memory cells 120 programmed with the first through the fourth logic states S11, S01, S00, and S10 may have the first through the fourth threshold voltage distributions, respectively. Because the first threshold voltage distribution of FIG. 11 is shifted to the right compared to the first threshold voltage distribution of FIG. 10, when the first default read voltage VRD1 is applied to the first memory cells 120, the ratio of on-cells among the first memory cells 120 is smaller than the first reference value (1/4). In this case, to reduce or minimize read errors the first default read voltage VRD1 may be modified to a voltage VRD1' of a point where the first threshold voltage distribution meets the second threshold voltage distribution.

Because the fourth threshold voltage distribution of FIG. 11 is shifted to the left compared to the fourth threshold voltage distribution of FIG. 10, when the third default read voltage VRD3 is applied to the first memory cells 120, the ratio of on-cells among the first memory cells 120 is bigger than the third reference value (3/4). In this case, to reduce or minimize read errors the third default read voltage VRD3 may be modified to a voltage VRD3' of a point where the third threshold voltage distribution meets the fourth threshold voltage distribution.

Figure 12B:
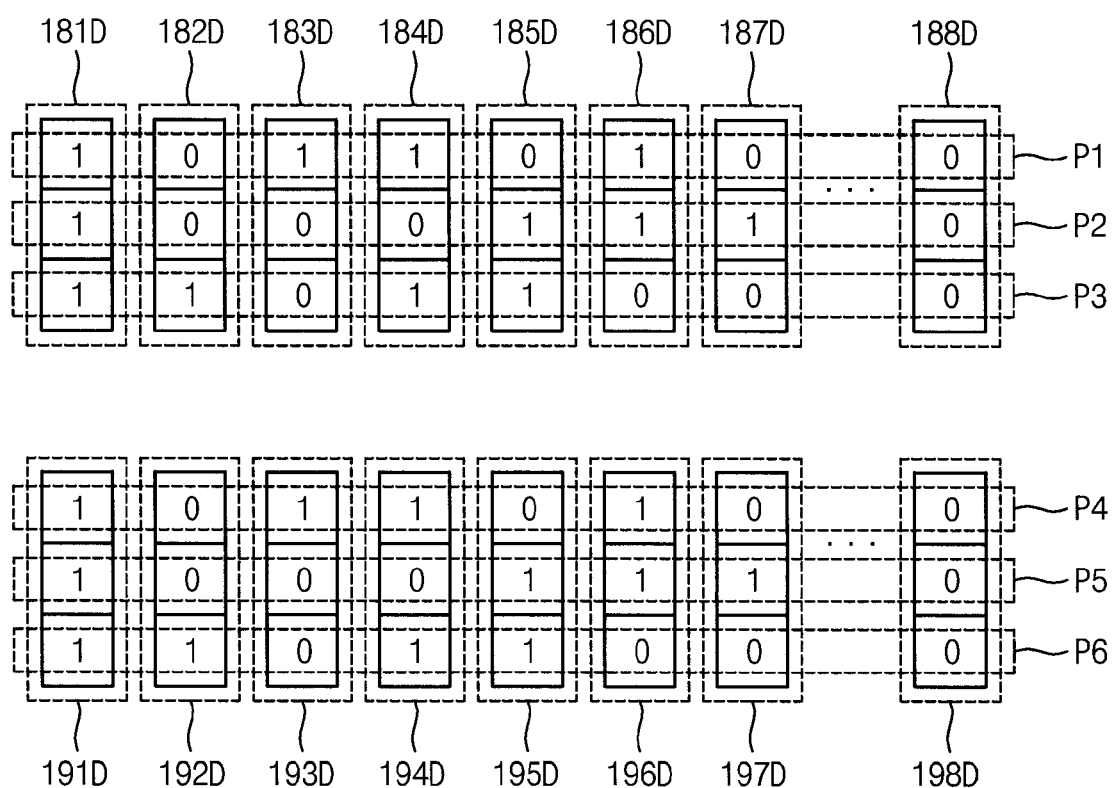

FIGS. 12A and 12B are diagrams illustrating data stored in memory cells included in the memory cell array of FIG. 7A. FIGS. 12A and 12B show a case where each of the memory cells included in the memory cell array 110 is a triple-level cell (TLC) storing 3 bits. FIG. 12A shows a case where data is stored to the memory cell array 110 so that logic states of the memory cells included in the memory cell array 110 are not balanced or equally used.

The memory cells 121 coupled to the first word line WL1 included in the memory cell array 110 of FIG. 7A includes first through eighth memory cells. The memory cells 122 coupled to the second word line WL2 included in the memory cell array 110 of FIG. 7A includes ninth through sixteenth memory cells.

Most significant bits of the memory cells 121 coupled to the first word line WL1 form a first page P1. Medium significant bits of the memory cells 121 coupled to the first word line WL1 form a second page P2. Least significant bits of the memory cells 121 coupled to the first word line WL1 form a third page P3. Most significant bits of the memory cells 122 coupled to the second word line WL2 form a fourth page P4. Medium significant bits of the memory cells 122 coupled to the second word line WL2 form a fifth page P5. Least significant bits of the memory cells 122 coupled to the second word line WL2 form a sixth page P6.

In FIG. 12A, the first page P1 includes 10110100, the second page P2 includes 10001110, the third page P3 includes 10110100, the fourth page P4 includes 11011000, the fifth page P5 includes 10001110, and the sixth page P6 includes 11011000.

In an example embodiment, each of the first memory cells 120 may have one of first through eighth logic states. In the first memory cell MC11, the first logic state indicates that the first memory cell MC11 stores 111'b, the second logic state indicates that the first memory cell MC11 stores 110'b, the third logic state indicates that the first memory cell MC11 stores 100'b, the fourth logic state indicates that the first memory cell MC11 stores 101'b, the fifth logic state indicates that the first memory cell MC11 stores 001'b, the sixth logic state indicates that the first memory cell MC11 stores 000'b, the seventh logic state indicates that the first memory cell MC11 stores 010'b, and the eighth logic state indicates that the first memory cell MC11 stores 011'b.

In FIG. 12A, the first memory cell includes 111'b (181C) and has the first logic state. The second memory cell includes 000'b (182C) and has the sixth logic state. The third memory cell includes 101'b (183C) and has the fourth logic state. The fourth memory cell includes 101'b (184C) and has the fourth logic state. The fifth memory cell includes 010'b (185C) and has the seventh logic state. The sixth memory cell includes 111'b (186C) and has the first logic state. The seventh memory cell includes 010'b (187C) and has the seventh logic state. The eighth memory cell includes 000'b (188C) and has the sixth logic state. The ninth memory cell includes 111'b (191C) and has first logic state. The tenth memory cell includes 101'b (192C) and has the fourth logic state. The eleventh memory cell includes 000'b (193C) and has the sixth logic state. The twelfth memory cell includes 101'b (194C) and has the fourth logic state. The thirteenth memory cell includes 111'b (195C) and has the first logic state. The fourteenth memory cell includes 010'b (196C) and has the seventh logic state. The fifteenth memory cell includes 010'b (197C) and has the seventh logic state. The sixteenth memory cell includes 000'b (198C) and has the sixth logic state.

In FIG. 12A, the first logic state is used 4 times, the second logic state is not used, the third logic state is not used, the fourth logic state is used 4 times, the fifth logic state is not used, the sixth logic state is used 4 times, the seventh logic state is used 4 times, and the eighth logic state is not used. In FIG. 12A, logic states of the memory cells are not balanced or equally used.

FIG. 12B shows a case where data is stored to the memory cell array 110 so that logic states of the memory cells included in the memory cell array 110 are balanced or equally used.

The first page P1 of FIG. 12B stores the most significant bits of the memory cells 121 coupled to the first word line WL1. The second page P2 of FIG. 12B stores medium significant bits of the memory cells 121 coupled to the first word line WL1. The third page P3 of FIG. 12B stores most significant bits of the memory cells 122 coupled to the second word line WL2. The fourth page P4 of FIG. 12B stores least significant bits of the memory cells 121 coupled to the first word line WL1. The fifth page P5 of FIG. 12B stores medium significant bits of the memory cells 122 coupled to the second word line WL2. The sixth page P6 of FIG. 12B stores least significant bits of memory cells 122 coupled to the second word line WL2.

In FIG. 12B, the first memory cell includes 111'b (181D) and has the first logic state. The second memory cell includes 001'b (182D) and has the fifth logic state. The third memory cell includes 100'b (183D) and has the third logic state. The fourth memory cell includes 101'b (184D) and has the fourth logic state. The fifth memory cell includes 011'b (185D) and has the eighth logic state. The sixth memory cell includes 110'b (186D) and has the second logic state. The seventh memory cell includes 010'b (187D) and has the seventh logic state. The eighth memory cell includes 000'b (188D) and has the sixth logic state. The ninth memory cell includes 111'b (191D) and has first logic state. The tenth memory cell includes 001'b (192D) and has the fifth logic state. The eleventh memory cell includes 100'b (193D) and has the third logic state. The twelfth memory cell includes 101'b (194D) and has the fourth logic state. The thirteenth memory cell includes 011'b (195D) and has the eighth logic state. The fourteenth memory cell includes 110'b (196D) and has the second logic state. The fifteenth memory cell includes 010'b (197D) and has the seventh logic state. The sixteenth memory cell includes 000'b (198D) and has the sixth logic state.

In FIG. 12B, the first through the eighth logic states are used 2 times, respectively. In FIG. 12B, logic states of the memory cells are balanced or equally used. The usage of the logic states of the memory cells may be controlled by modifying storing location as described above.

Figure 13:
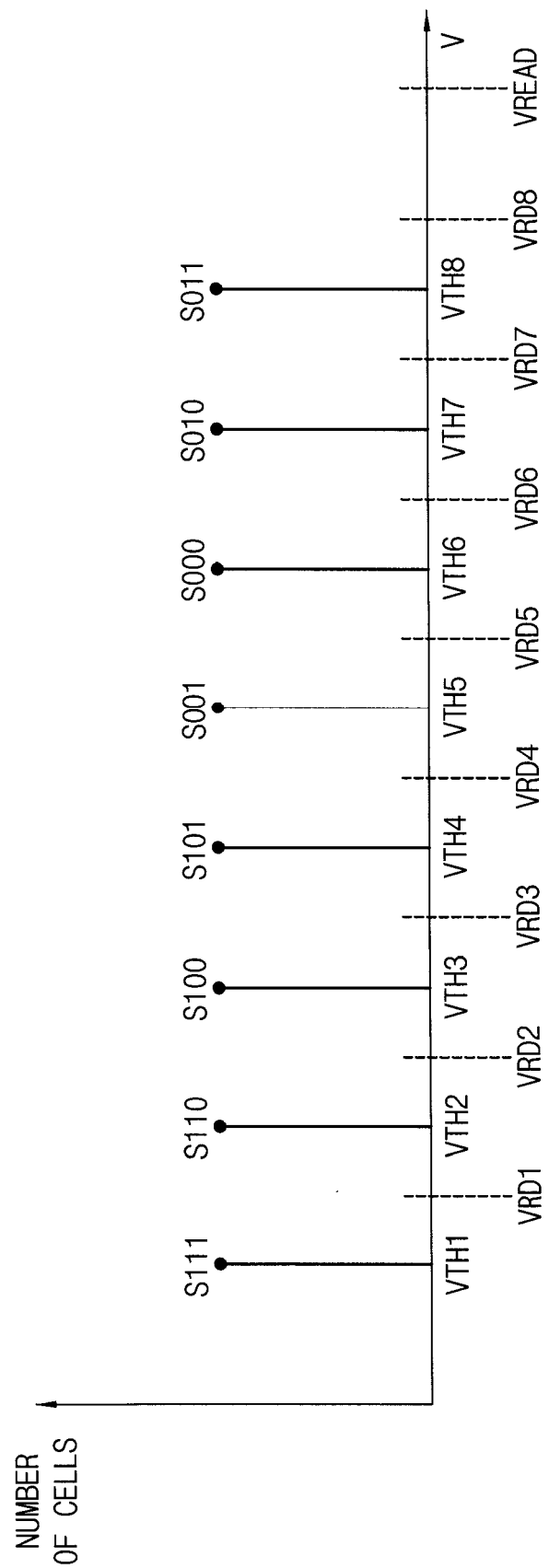
FIGS. 13 through 15 are graphs illustrating threshold voltages of the first memory cells included in the memory cell array of FIG. 7A.
Figure 14:
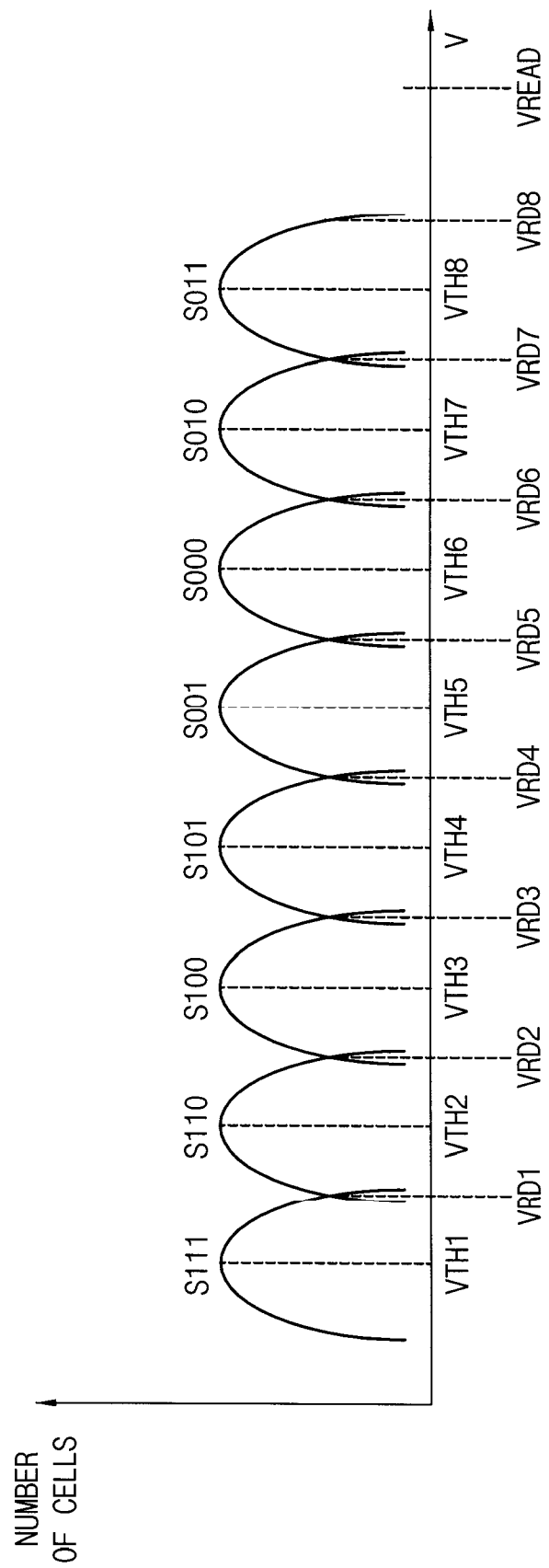
Figure 15:
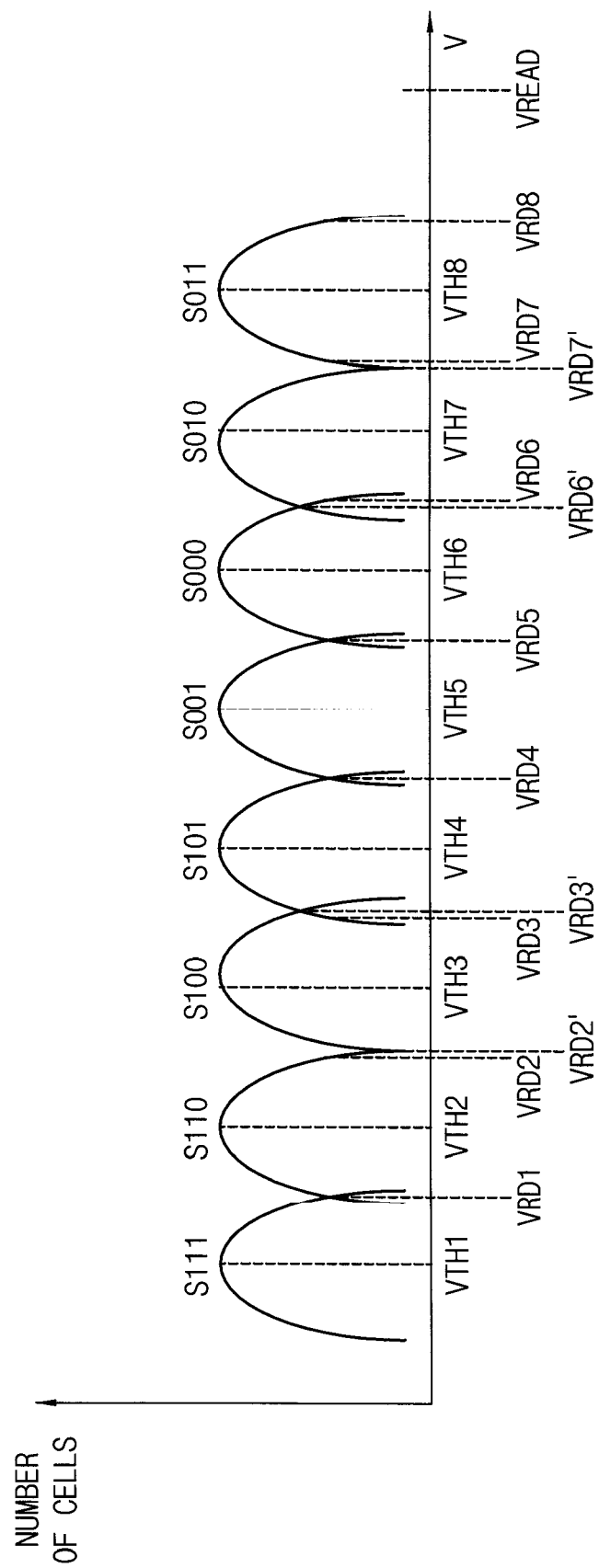

FIGS. 13 through 15 are graphs illustrating threshold voltages of the first memory cells included in the memory cell array of FIG. 7A. FIG. 13 shows a case where threshold voltages of the first memory cells 120 of FIG. 7 are not scattered.

The first memory cells 120 include a first memory cell. When the first memory cell has the first logic states S111, the first memory cell may be programmed with the first threshold voltage VTH1. When the first memory cell has the second logic state S110, the first memory cell may be programmed with the second threshold voltage VTH2. When the first memory cell has the third logic state S100, the first memory cell may be programmed with the third threshold voltage VTH3. When the first memory cell has the fourth logic state S101, the first memory cell may be programmed with the fourth threshold voltage VTH4. When the first memory cell has the fifth logic state S001, the first memory cell may be programmed with the fifth threshold voltage VTH5. When the first memory cell has the sixth logic state S000, the first memory cell may be programmed with the sixth threshold voltage VTH6. When the first memory cell has the seventh logic state S010, the first memory cell may be programmed with the seventh threshold voltage VTH7. When the first memory cell has the eighth logic state S011, the first memory cell may be programmed with the eighth threshold voltage VTH8. Each of the first memory cells 120 may be programmed in the same way as the first memory cell.

FIG. 13 shows a case where data is stored to the first memory cells 120 so that the logic states of the first memory cells 120 are equally used like FIG. 12B, and the first memory cells 120 are programmed with the first threshold voltage VTH1 through the eighth threshold voltage VTH8 corresponding to the logic states.

When the first default read voltage VRD1 is applied to the first memory cells 120, memory cells, which have the first threshold voltage VTH1, among the first memory cells 120 become on-cells, and the first reference value corresponding to the first default read voltage VRD1 may be 1/8. In the same way, the second reference value corresponding to the second default read voltage VRD2 may be 2/8, the third reference value corresponding to the third default read voltage VRD3 may be 3/8, the fourth reference value corresponding to the fourth default read voltage VRD4 may be 4/8, the fifth reference value corresponding to the fifth default read voltage VRD5 may be 5/8, the sixth reference value corresponding to the sixth default read voltage VRD6 may be 6/8, the seventh reference value corresponding to the seventh default read voltage VRD7 may be 7/8, and the eighth reference value corresponding to the eighth default read voltage VRD8 may be 1.

The maximum read voltage VREAD, which is applied to memory cells that are not a target of reading, may have a higher level than the first through eighth default read voltages VRD1 through VRD8.

FIG. 14 shows a case where data is stored to the first memory cells 120 so that the logic states of the first memory cells 120 are equally used like FIG. 12B, the first memory cells 120 are programmed with the first threshold voltage VTH1 through the eighth threshold voltage VTH8 corresponding to the logic states, and the threshold voltages of the first memory cells 120 are scattered because of a charge leakage, a program disturb, an electrical coupling, a change in temperature, a change in voltage etc. during a program operation or after a program operation.

The first memory cells 120 programmed with the first through the eighth logic states S111, S110, S100, S101, S001, S000, S010, and S011 may have the first through the eighth threshold voltage distributions, respectively.

Unlike FIG. 13, when the first default read voltage VRD1 is applied to the first memory cells 120, memory cells, which are programmed as the first logic state S111 and have a threshold voltage smaller than or equal to the first default read voltage VRD1, become the first on-cells, memory cells, which are programmed as the first logic state S111 and have a threshold voltage bigger than the first default read voltage VRD1, becomes the first off-cells, and memory cells, which are programmed as the second logic state S110 and have a threshold voltage smaller than or equal to the first default read voltage VRD1, becomes the second on-cells. The first off-cells and the second on-cells may generate read errors. The read errors may be corrected based on the error correction code. The case where one of the second through the eighth default read voltages VRD2 through VRD8 is applied to the first memory cells 120 may be understood based on the description.

FIG. 15 shows a case where data is stored to the first memory cells 120 so that the logic states of the first memory cells 120 are equally used like FIG. 12B, the first memory cells 120 are programmed with the first threshold voltage VTH1 through the eighth threshold voltage VTH8 corresponding to the logic states, and the threshold voltages of the first memory cells 120 are modified because of a charge leakage, a program disturb, an electrical coupling, a change in temperature, a change in voltage etc. during a program operation or after a program operation.

The first memory cells 120 programmed with the first through the eighth logic states S111, S110, S100, S101, S001, S000, S010, and S011 may have the first through the eighth threshold voltage distributions, respectively. Because the third threshold voltage distribution of FIG. 15 is shifted to the right compared to the third threshold voltage distribution of FIG. 14, when the second default read voltage VRD2 is applied to the first memory cells 120, the ratio of on-cells among the first memory cells 120 is smaller than the second reference value (2/8). In this case, to reduce or minimize read errors the second default read voltage VRD2 may be modified to a voltage VRD2' of a point where the second threshold voltage distribution meets the third threshold voltage distribution and the third default read voltage VRD3 may be modified to a voltage VRD3' of a point where the third threshold voltage distribution meets the fourth threshold voltage distribution.

Because the seventh threshold voltage distribution of FIG. 15 is shifted to the left compared to the seventh threshold voltage distribution of FIG. 14, when the sixth default read voltage VRD6 is applied to the first memory cells 120, the ratio of on-cells among the first memory cells 120 is bigger than the sixth reference value (6/8). In this case, to reduce or minimize read errors the sixth default read voltage VRD6 may be modified to a voltage VRD6' of a point where the sixth threshold voltage distribution meets the seventh threshold voltage distribution and the seventh default read voltage VRD7 may be modified to a voltage VRD7' of a point where the seventh threshold voltage distribution meets the eighth threshold voltage distribution.

Figure 16:
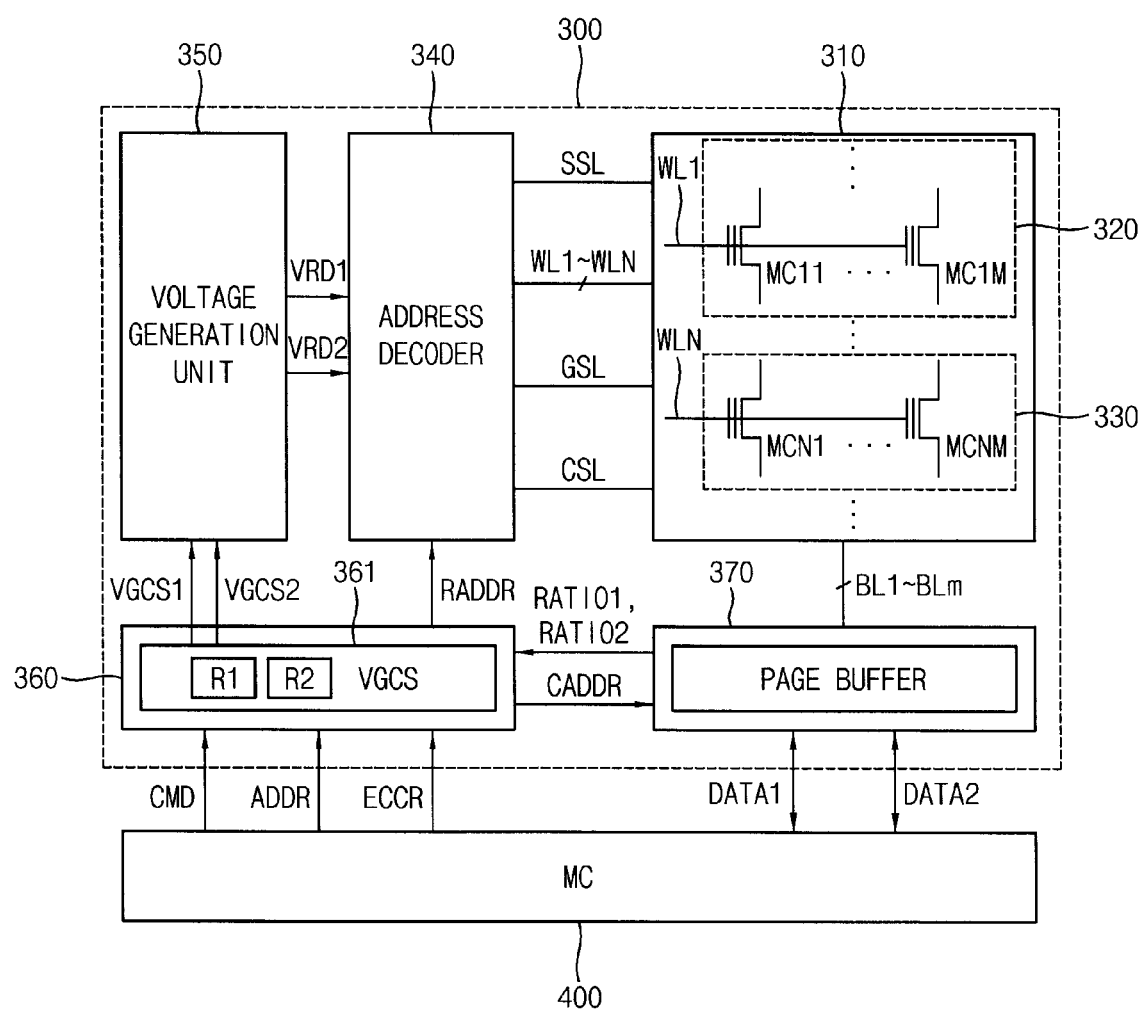
FIGS. 16 through 18 are block diagrams illustrating memory systems including the non-volatile memory device according to example embodiments.
Figure 17:
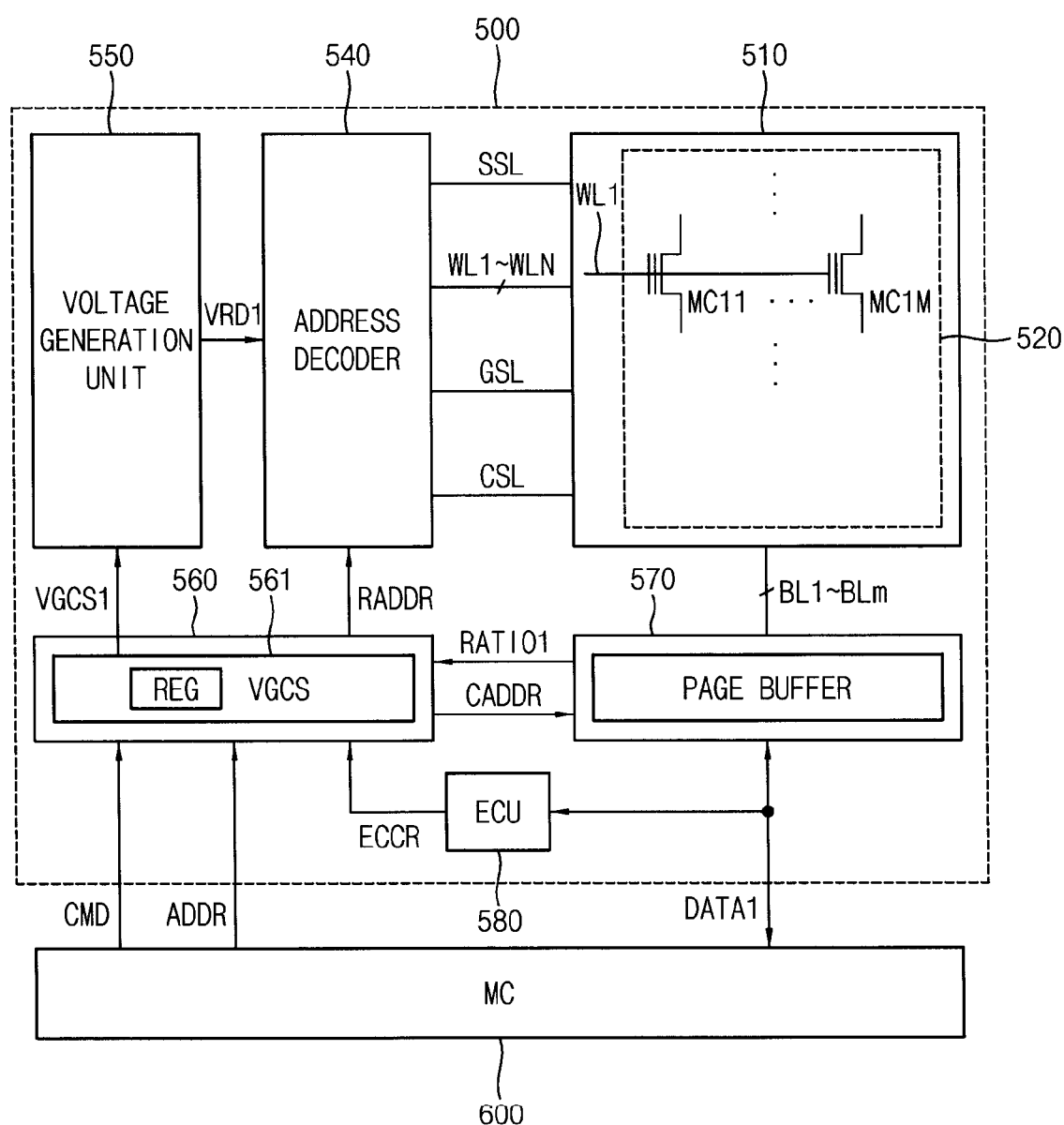
Figure 18:
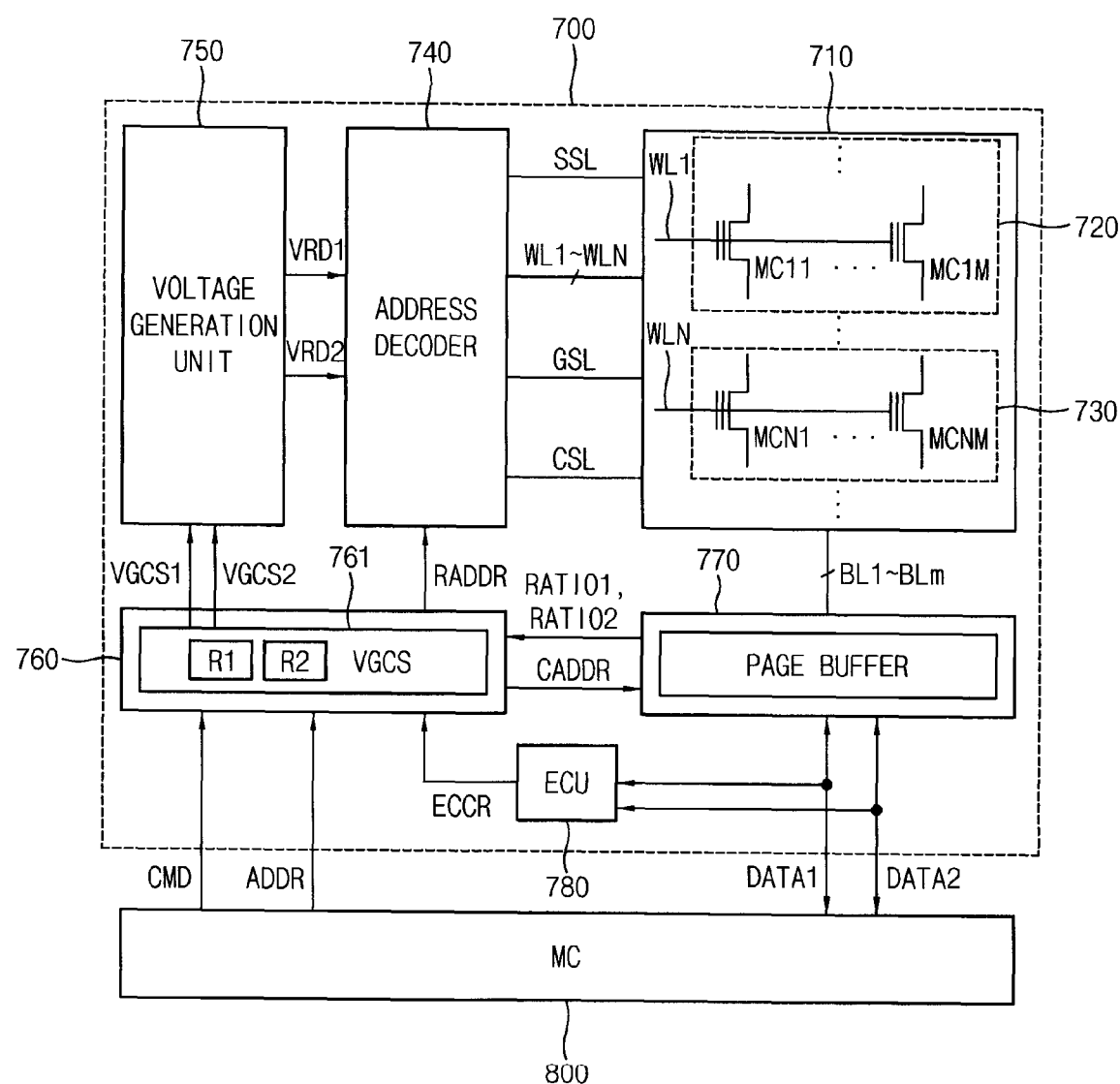

FIGS. 16 through 18 are block diagrams illustrating memory systems including the non-volatile memory device according to example embodiments. Referring to FIG. 16, a non-volatile memory device 300 includes a memory cell array 310, a control circuit 360, a voltage generation circuit 350, an address decoder 340, and a data I/O circuit 370. The data I/O circuit 370 includes a page buffer PAGE BUFFER.

The memory cell array 310 includes a plurality of first memory cells 320 and a plurality of second memory cells 330. Each of the first and second memory cells 320, 330 stores a plurality of data bits as one of a plurality of threshold voltages corresponding to a plurality of logic states. The control circuit 360 generates a row address signal RADDR and a column address signal CADDR based on a command signal CMD and an address signal ADDR. The voltage generation circuit 350 generates a first default read voltage VRD1 and a second default read voltage VRD2 based on a first default read voltage control signal VGCS1 and a second default read voltage control signal VGCS2. The address decoder 340 applies the first default read voltage VRD1 to a first word line WL1 corresponding to the row address signal RADDR when the command signal CMD is a read command signal of the first memory cells 320. The address decoder 340 applies the second default read voltage VRD2 to a (N)-th word line WLN corresponding to the row address signal RADDR when the command signal CMD is a read command signal of the second memory cells 330.

The page buffer PAGE BUFFER receives a data stored in memory cells MC11 through MC1M coupled to the first word line WL1 or a data stored in memory cells MCN1 through MCNM coupled to the (N)-th word line WLN through a plurality of bit lines BL1 through BLM in response to the column address signal CADDR, extracts a first read data DATA1 or a second read data DATA2 from the received data, and measures a first ratio RATIO1 of first on-cells, each of which has a threshold voltage smaller than or equal to the first default read voltage VRD1, among the first memory cells 320 or a second ratio RATIO2 of second on-cells, each of which has a threshold voltage smaller than or equal to the second default read voltage VRD2, among the second memory cells 330 based on the received data.

The page buffer PAGE BUFFER may execute extraction of the first read data DATA1 or the second read data DATA2 and measurement of the first ratio RATIO1 or the second ratio RATIO2 simultaneously.

A first data is programmed to the first memory cells 320 so that the logic states of the first memory cells 320 are equally used. A second data is programmed to the second memory cells 330 so that logic states of the second memory cells 330 are equally used. Detailed description of the case may be understood based on reference to FIGS. 8A, 8B, 12A, and 12B.

The control circuit 360 includes a read voltage controller 361. The read voltage controller 361 may include a first register R1 storing a level of the first default read voltage control signal VGCS1 and a second register R2 storing a level of the second default read voltage control signal VGCS2.

The read voltage controller 361 generates the first default read voltage control signal VGCS1, which modifies the first default read voltage VRD1, based on the first ratio RATIO1 and a first reference value corresponding to the first default read voltage VRD1 when a result of correction ECCR of errors included in the first read data DATA1 represents a failure. The read voltage controller 361 generates the second default read voltage control signal VGCS2, which modifies the second default read voltage VRD2, based on the second ratio RATIO2 and a second reference value corresponding to the second default read voltage VRD2 when a result of correction ECCR of errors included in the second read data DATA2 represents a failure.

Referring to FIG. 17, a non-volatile memory device 500 has the same structure as the non-volatile memory device 300 of FIG. 15 except an error corrector 580 which generates the result of the correction ECCR of errors included in the first read data DATA1 based on the first read data DATA1 and the error correction code instead of the memory controller 600.

The error corrector 580 may check whether the first read data DATA1 includes uncorrectable errors or not based on parity bits included in the first read data DATA1. If the first read data DATA1 includes the uncorrectable errors, the error corrector 580 may fail to correct the errors and may generate the result of the correction ECCR representing a failure of correction. If the first read data DATA1 does not include the uncorrectable errors, the error corrector 580 may succeed to correct the errors, may generate the result of the correction ECCR representing success of correction and may restore an original programmed data from the first read data DATA1.

Referring to FIG. 18, a non-volatile memory device 700 has the same structure as the non-volatile memory device 500 of FIG. 16 except an error corrector 780 which generates the result of the correction ECCR of errors included in the first read data DATA1 and the second read data DATA2 based on the first read data DATA1, the second read data DATA2, and the error correction code instead of the memory controller 800.

Figure 19:
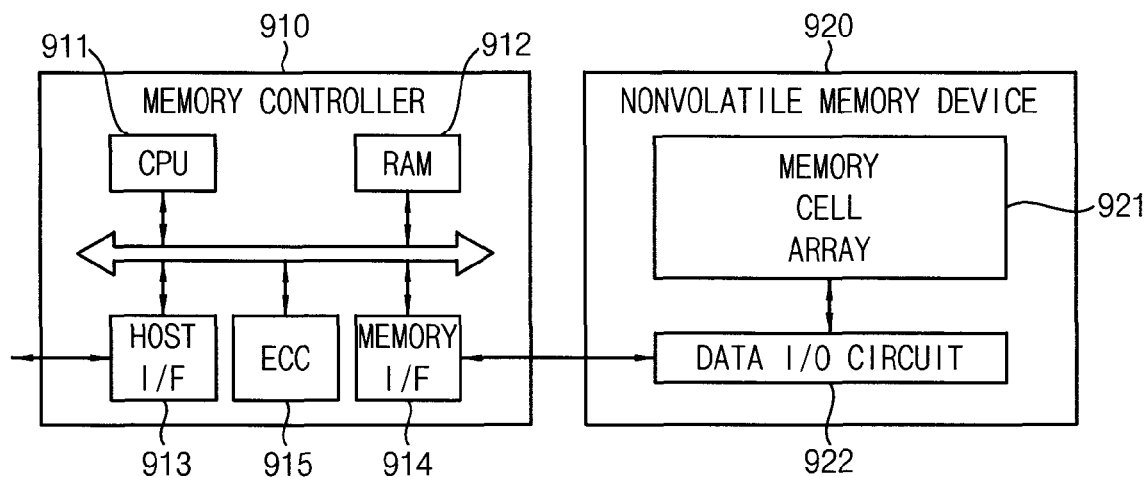
FIG. 19 is a block diagram illustrating a memory system according to an example embodiment.

FIG. 19 is a block diagram illustrating a memory system according to an example embodiment. Referring to FIG. 19, a memory system 900 includes a memory controller 910 and a non-volatile memory device 920. The non-volatile memory device 920 includes a memory cell array 921 and a data I/O circuit 922. The memory cell array 921 is formed on a substrate in a 3-D structure. The memory cell array 921 having the 3-D structure may be understood based on reference to FIGS. 7B and 7C.

The data I/O circuit 922 is connected to the memory cell array 921 through the plurality of bit lines. The data I/O circuit 922 may select at least one of the plurality of bit lines, output data read from a memory cell connected to the selected at least one bit line to the memory controller 910, and write data received from the memory controller 910 in a memory cell connected to the selected at least one bit line.

The non-volatile memory device 920 may be implemented with the non-volatile memory device 100 included in the memory system of FIG. 6, the non-volatile memory device 300 included in the memory system of FIG. 16, the non-volatile memory device 500 included in the memory system of FIG. 17, or the non-volatile memory device 700 included in the memory system of FIG. 18. The non-volatile memory device 920 may be understood based on reference to FIGS. 1 through 18.

The memory controller 910 may control the non-volatile memory device 920. The memory controller 910 may control data transfer between an external host and the non-volatile memory device 920. The memory controller 910 may include a central processing unit 911, a buffer memory 912, a host interface 913 and a memory interface 914.

The central processing unit 911 may perform operations for the data transfer. The buffer memory 912 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 912 may be an operational memory of the central processing unit 911. In some example embodiments, the buffer memory 912 may be included in the memory controller 910. In other example embodiments, the buffer memory 912 may be outside of the memory controller 910.

The host interface 913 may be coupled to the host, and the memory interface 914 may be coupled to the non-volatile memory device 920. The central processing unit 911 may communicate with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 911 may communicate with the non-volatile memory device 920 via the memory interface 914.

In some example embodiments, the memory controller 910 may further include an error correction block 915 for error correction.

In some example embodiments, the memory controller 910 may be built in the non-volatile memory device 920, or the memory controller 910 and the non-volatile memory device 920 may be implemented as separate chips.

The memory system 900 may be implemented as a memory card, a solid state drive, and so on.

Figure 20:
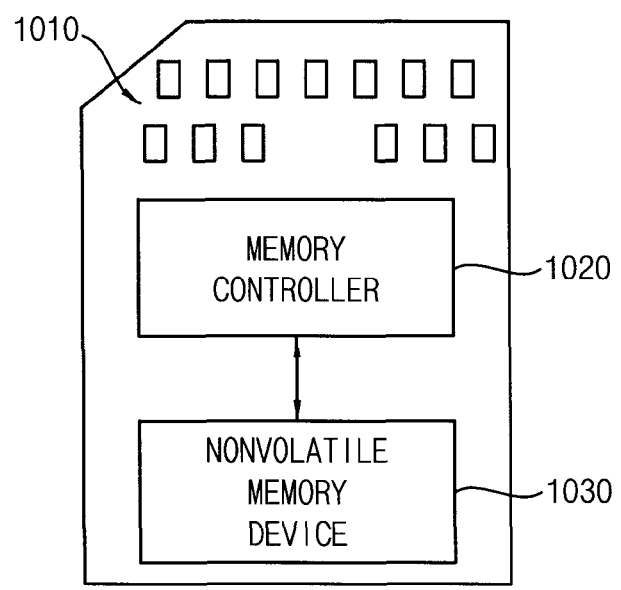
FIG. 20 is a block diagram illustrating a memory card according to an example embodiment.

FIG. 20 is a block diagram illustrating a memory card according to an example embodiment. Referring to FIG. 20, a memory card 1000 includes a plurality of connecting pins 1010, a memory controller 1020 and a non-volatile memory device 1030.

The connecting pins 1010 may be coupled to an external host to transfer signals between the host and the memory card 1000. The connecting pins 1010 may include a clock pin, a command pin, a data pin and/or a reset pin.

The memory controller 1020 may receive data from the host, and may store the received data in the non-volatile memory device 1030.

The non-volatile memory device 1030 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The non-volatile memory device 1030 may be implemented with the non-volatile memory device 100 included in the memory system of FIG. 6, the non-volatile memory device 300 included in the memory system of FIG. 16, the non-volatile memory device 500 included in the memory system of FIG. 17, or the non-volatile memory device 700 included in the memory system of FIG. 18. The non-volatile memory device 1030 may be understood based on reference to FIGS. 1 through 18.

The memory card 1000 may include an MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some example embodiments, the memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 21:
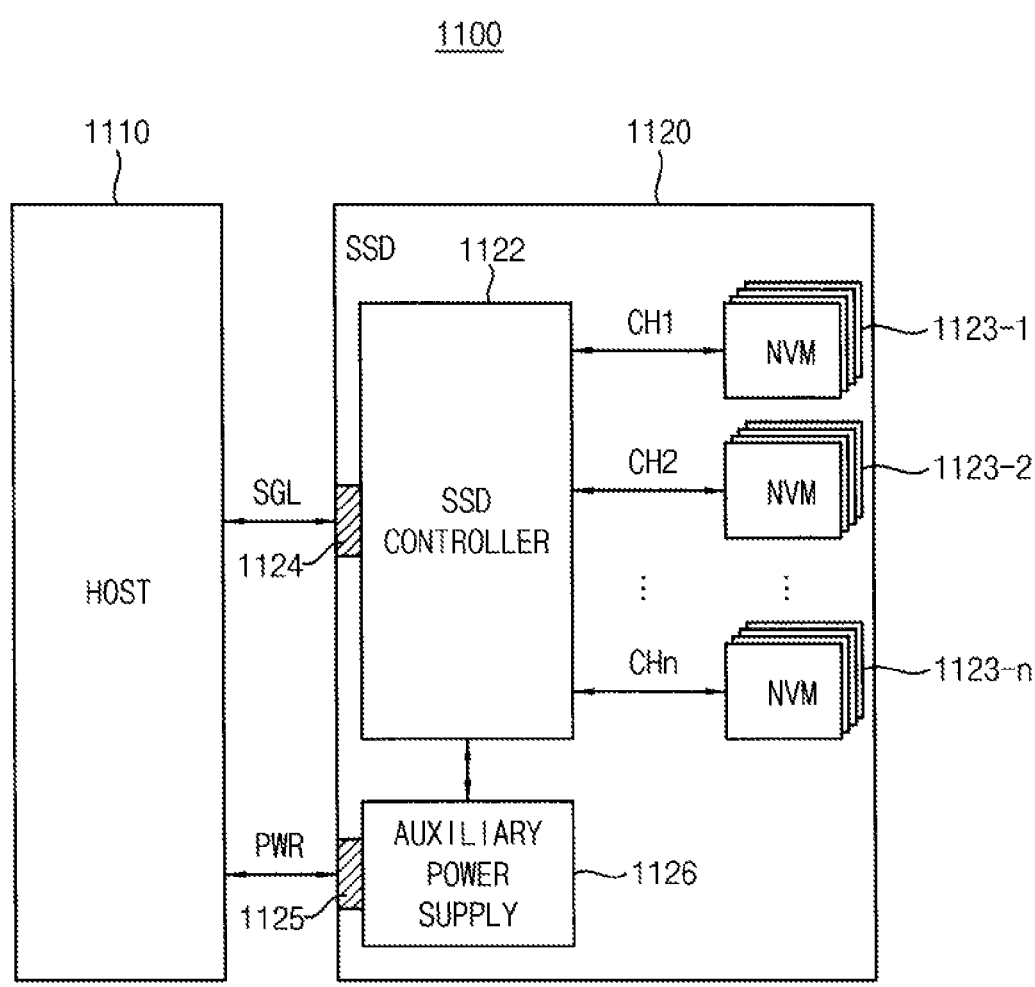
FIG. 21 is a block diagram illustrating a solid-state drive system according to an example embodiment.

FIG. 21 is a block diagram illustrating a solid-state drive system according to an example embodiment. Referring to FIG. 21, an SSD system 1100 includes a host 1110 and a SSD 1120. The SSD 1120 includes first through n-th nonvolatile memory devices 1123-1, 1123-2, . . . , 1123-n and a SSD controller 1122. The first through n-th nonvolatile memory devices 1123-1, 1123-2, . . . , 1123-n may be used as a storage medium of the SSD 1120.

Each of the first through n-th nonvolatile memory devices 1123-1, 1123-2, . . . , 1123-n may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

Each of the first through n-th nonvolatile memory devices 1123-1, 1123-2, . . . , 1123-n may be implemented with the non-volatile memory device 100 included in the memory system of FIG. 6, the non-volatile memory device 300 included in the memory system of FIG. 16, the non-volatile memory device 500 included in the memory system of FIG. 17, or the non-volatile memory device 700 included in the memory system of FIG. 18. The first through n-th nonvolatile memory devices 1123-1, 1123-2, . . . , 1123-n may be understood based on reference to FIGS. 1 through 18.

The SSD controller 1122 is coupled to the first through n-th nonvolatile memory devices 1123-1, 1123-2, . . . , 1123-n by first through n-th channels CH1, CH2, . . . , CHn, respectively. The SSD controller 1122 may exchange a signal SGL with the host 1110 through a signal connector 1124. The signal SGL may include a command, an address and data. The SSD controller 1122 may perform a program operation and a read operation on the first through n-th nonvolatile memory devices 1123-1, 1123-2, . . . , 1123-n according to the command received from the host 1110.

The SSD 1120 may further include an auxiliary power supply 1126. The auxiliary power supply 1126 may receive power PWR from the host 1110 through a power connector 1125 and provide power to the SSD controller 1122. The auxiliary power supply 1126 may be placed inside or outside the SSD 1120. For example, the auxiliary power supply 1126 may be placed in a main board and provide auxiliary power to the SSD 1120.

Figure 22:
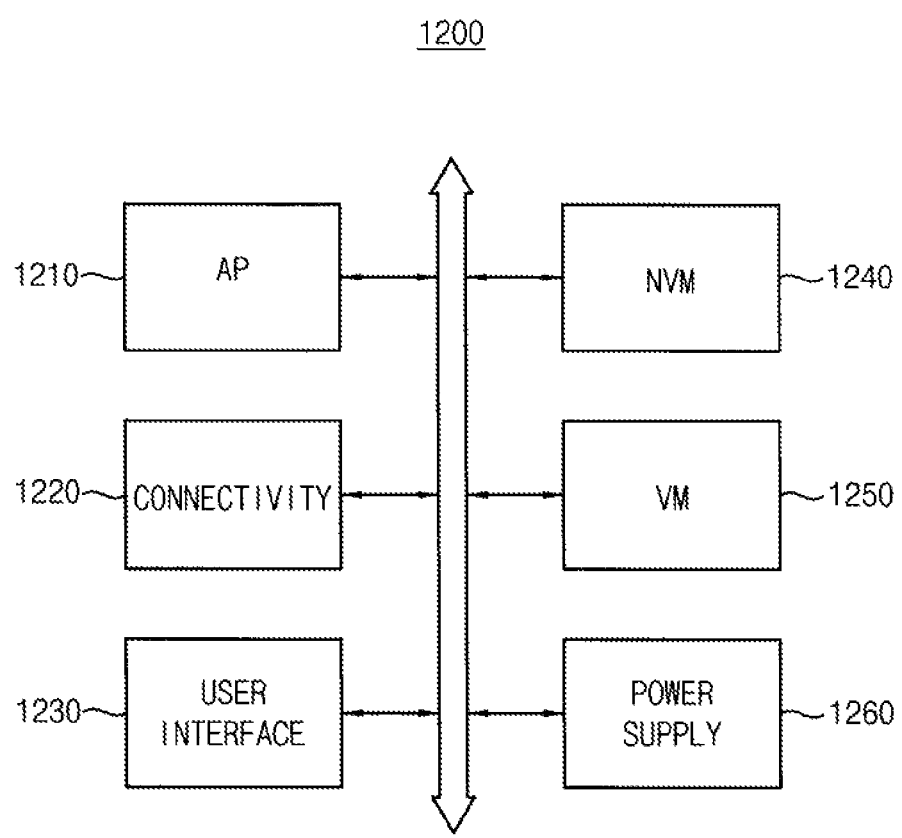
FIG. 22 is a block diagram illustrating a mobile system according to an example embodiment.

FIG. 22 is a block diagram illustrating a mobile system according to an example embodiment. Referring to FIG. 22, a mobile system 1200 includes an application processor AP 1210, a connectivity unit 1220, a user interface 1230, a nonvolatile memory device NVM 1240, a volatile memory device VM 1250 and a power supply 1260.

In some embodiments, the mobile system 1200 may be a mobile phone, a smart phone, a personal digital assistant (PDA), a portable multimedia player (PMP), a digital camera, a music player, a portable game console, a navigation system, etc.

The application processor 1210 may execute applications, such as a web browser, a game application, a video player, etc. In some example embodiments, the application processor 1210 may include a single core or multiple cores. For example, the application processor 1210 may be a multi-core processor, such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, the connectivity unit 1220 may include a baseband chipset that supports communications, such as the global system for mobile communications (GSM), general packet radio service (GPRS), wideband code division multiple access (WCDMA), high speed downlink/uplink packet access (HSxPA), etc.

The nonvolatile memory device 1240 may store a boot image for booting the mobile system 1200.

The nonvolatile memory device 1240 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The non-volatile memory device 1240 may be implemented with the non-volatile memory device 100 included in the memory system of FIG. 6, the non-volatile memory device 300 included in the memory system of FIG. 16, the non-volatile memory device 500 included in the memory system of FIG. 17, or the non-volatile memory device 700 included in the memory system of FIG. 18. The non-volatile memory device 1240 may be understood based on reference to FIGS. 1 through 18.

The volatile memory device 1250 may store data processed by the application processor 1210, or may operate as a working memory. The user interface 1230 may include at least one input device, such as a keypad, a touch screen, etc., and at least one output device, such as a speaker, a display device, etc. The power supply 1260 may supply a power supply voltage to the mobile system 1200.

In some embodiments, the mobile system 1200 may further include an image processor, and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of example embodiments and is not to be construed as limiting thereof. Although a few example embodiments have been described, those skilled in the art will readily appreciate that many modifications are possible in the example embodiments without materially departing from the teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of determining a default read voltage of a non-volatile memory device which includes a plurality of first memory cells, each of which is configured to store a plurality of data bits as one of a plurality of threshold voltages corresponding to a plurality of logic states, the method comprising:
    programming a first data to the first memory cells so that each of the logic states are programmed into the first memory cells an equal number of times;
    applying a first default read voltage from among a plurality of default read voltages to word lines coupled to the first memory cells, and measuring a first ratio of first on-cells, each of which has a threshold voltage smaller than or equal to the first default read voltage, among the first memory cells; and
    modifying the first default read voltage based on the first ratio and a first reference value corresponding to the first default read voltage.

2. The method of claim 1, wherein the first reference value is a ratio of second on-cells, each of which has a threshold voltage smaller than or equal to the first default read voltage, among the first memory cells when the first default read voltage is applied to the word lines and threshold voltages of the first memory cells are not scattered.

3. The method of claim 1, wherein the modifying the first default read voltage based on the first ratio and the first reference value corresponding to the first default read voltage comprises decreasing the first default read voltage when the first ratio is bigger than the first reference value.

4. The method of claim 1, wherein the modifying the first default read voltage based on the first ratio and the first reference value corresponding to the first default read voltage comprises increasing the first default read voltage when the first ratio is smaller than the first reference value.

5. The method of claim 1, further comprising:
    applying a second default read voltage from among the plurality of default read voltages to the word lines, and measuring a second ratio of second on-cells, each of which has a threshold voltage smaller than or equal to the second default read voltage, among the first memory cells; and
    modifying the second default read voltage based on the second ratio and a second reference value corresponding to the second default read voltage.

6. The method of claim 1, wherein the non-volatile memory device further comprises a plurality of second memory cells, each of which is configured to store a plurality of data bits as one of the threshold voltages corresponding to the logic states.

7. The method of claim 6, further comprising:
    programming a second data to the second memory cells so that each of the logic states are programmed into the second memory cells an equal number of times;
    applying a second default read voltage from among the plurality of default read voltages to word lines coupled to the second memory cells, and measuring a second ratio of second on-cells, each of which has a threshold voltage smaller than or equal to the second default read voltage, among the second memory cells; and
    modifying the second default read voltage based on the second ratio and a second reference value corresponding to the second default read voltage,
    wherein a level of the first default read voltage is the same as a level of the second default read voltage, and a level of the modified first default read voltage is different from a level of the modified second default read voltage.

8. A method of reading data of a non-volatile memory device which includes a plurality of memory cells, each of which is configured to store a plurality of data bits as one of a plurality of threshold voltages corresponding to a plurality of logic states, the method comprising:
    programming a first data to the memory cells so that each of the logic states are programmed into the memory cells an equal number of times;
    reading a data stored in the memory cells as a second data based on default read voltages;
    applying a first default read voltage from among the default read voltages to word lines coupled to the memory cells, and measuring a first ratio of first on-cells, each of which has a threshold voltage smaller than or equal to the first default read voltage, among the memory cells;
    attempting to correct errors included in the second data based on an error correction code;
    outputting the first data corrected from the second data as a read data of the memory cells when correction of the errors included in the second data succeeds; and
    modifying the first default read voltage based on the first ratio and a first reference value corresponding to the first default read voltage and reading the data stored in the memory cells as a third data based on the default read voltages including the modified first default read voltages when correction of the errors included in the second data fails.

9. The method of claim 8, further comprising:
    attempting to correct errors included in the third data based on the error correction code;
    outputting the first data corrected from the third data as the read data of the memory cells when correction of the errors included in the third data succeeds; and
    reading another data stored in the memory cells based on the default read voltages including the modified first default read voltage when correction of the errors included in the third data succeeds.

10. The method of claim 9, further comprising, when correction of the errors included in the third data fails, re-modifying the first default read voltage and reading the data stored in the memory cell as the third data based on the default read voltages including the re-modified first default read voltage until correction of the errors included in the third data succeeds.

11. The method of claim 9, further comprising, when correction of the errors from among the third data fails, applying a second default read voltage included in the default read voltages to the word lines, measuring a second ratio of second on-cells, each of which has a threshold voltage smaller than or equal to the second default read voltage, among the memory cells, modifying the second default read voltage based on the second ratio and a second reference value corresponding to the second default read voltage, and reading the data stored in the memory cell as the third data based on the default read voltages including the modified second default read voltage.

12. The method of claim 8, wherein the reading the data stored in the memory cells as the second data based on the default read voltages and the applying the first default read voltage from among the default read voltages to the word lines coupled to the memory cells are performed simultaneously.

13. A non-volatile memory device comprising:
- a memory cell array including a plurality of first memory cells each configured to store a plurality of data bits as one of a plurality of threshold voltages corresponding to a plurality of logic states;
- a control circuit configured to generate a row address signal and a column address signal based on a command signal and an address signal;
- a voltage generation circuit configured to generate a first default read voltage based on a first default read voltage control signal;
- an address decoder configured to apply the first default read voltage to a first word line corresponding to the row address signal when the command signal is a read command signal of the first memory cells; and
- a data I/O circuit including a page buffer configured to receive a data stored in memory cells coupled to the first word line through a plurality of bit lines in response to the column address signal, extract a first read data from the received data, and measure a first ratio of first on-cells, each of which has a threshold voltage smaller than or equal to the first default read voltage, among the first memory cells based on the received data,
- wherein a first data is programmed to the first memory cells so that each of the logic states are programmed into the first memory cells an equal number of times, and
- wherein the control circuit comprises a read voltage controller configured to generate the first default read voltage control signal, which modifies the first default read voltage, based on the first ratio and a first reference value corresponding to the first default read voltage when a result of correction of errors included in the first read data represents a failure.

14. The non-volatile memory device of claim 13, further comprising a memory controller configured to generate the result of the correction based on the first read data.

15. The non-voltage memory device of claim 13, further comprising an error corrector configured to generate the result of the correction based on the first read data and an error correction code.

16. The non-volatile memory device of claim 13, wherein the read voltage controller is configured to generate the first default read voltage control signal to decrease the first default read voltage when the first ratio is bigger than the first reference value.

17. The non-volatile memory device of claim 13, wherein the read voltage controller is configured to generate the first default read voltage control signal to increase the first default read voltage when the first ratio is smaller than the first reference value.

18. The non-volatile memory device of claim 13, wherein the memory cell array further comprises a plurality of second memory cells, each of which is configured to store a plurality of data bits as one of the threshold voltages corresponding to the logic states;
- wherein the voltage generation circuit is configured to generate a second default read voltage based on a second default read voltage control signal;
- wherein the address decoder is configured to apply the second default read voltage to a second word line corresponding to the row address signal when the command signal is a read command signal of the second memory cells;
- wherein the page buffer is configured to receive a data stored in memory cells coupled to the second word line through the plurality of bit lines in response to the column address signal, extract a second read data from the received data, and measure a second ratio of second on-cells, each of which has a threshold voltage smaller than or equal to the second default read voltage, among the second memory cells based on the received data;
- wherein a second data is programmed to the second memory cells so that each of the logic states are programmed into the second memory cells an equal number of times;
- wherein the read voltage controller is configured to generate the second default read voltage control signal, which modifies the second default read voltage, based on the second ratio and a second reference value corresponding to the second default read voltage when a result of correction of errors included in the second read data represents a failure; and
- wherein a level of the first default read voltage is the same as a level of the second default read voltage, and a level of the modified first default read voltage is different from a level of the modified second default read voltage.

19. The non-volatile memory device of claim 18, wherein the read voltage controller comprises a first register configured to store a level of the first default read voltage control signal.

20. The non-volatile memory device of claim 19, wherein the read voltage controller comprises a second register configured to store a level of the second default read voltage control signal.

* * * * *